(12) United States Patent
Boos et al.

(10) Patent No.: US 8,891,681 B2
(45) Date of Patent: Nov. 18, 2014

(54) TRANSMITTERS AND METHODS

(71) Applicant: Intel Mobile Communications GmbH, Neubiberg (DE)

(72) Inventors: Zdravko Boos, Munich (DE); Bernd-Ulrich Klepser, Starnberg (DE); Martin Simon, Otterfing (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/835,693

(22) Filed: Mar. 15, 2013

(65) Prior Publication Data

US 2013/0251068 A1  Sep. 26, 2013

Related U.S. Application Data

(60) Provisional application No. 61/613,102, filed on Mar. 20, 2012.

(30) Foreign Application Priority Data

| Mar. 20, 2012 | (DE) | 10 2012 204 448 |
| Mar. 20, 2012 | (DE) | 10 2012 204 450 |
| Mar. 20, 2012 | (DE) | 10 2012 204 451 |

(51) Int. Cl.
| *H03C 3/00* | (2006.01) |
| *H04L 27/20* | (2006.01) |
| *H04L 25/02* | (2006.01) |
| *H04L 27/00* | (2006.01) |

(52) U.S. Cl.
CPC .......... *H04L 27/00* (2013.01); *H04L 27/20* (2013.01); *H04L 25/0282* (2013.01)
USPC ........... 375/302; 375/224; 375/267; 375/295; 375/298

(58) Field of Classification Search
CPC ....... H04L 27/20; H04L 27/362; H04L 27/00; H04L 27/34; H04L 27/36; H04L 27/04; H03C 5/00; H03F 3/24; H03F 2200/336
USPC .......... 375/302, 224, 267, 295, 298; 370/252, 370/338
See application file for complete search history.

(56) References Cited

U.S. PATENT DOCUMENTS

| 4,972,440 A | 11/1990 | Ernst et al. |
| 5,751,142 A | 5/1998 | Dosho et al. |

(Continued)

FOREIGN PATENT DOCUMENTS

EP  233950 A1  9/1987

OTHER PUBLICATIONS

U.S. Appl. No. 13/834,736, filed Mar. 15, 2013. 77 Pages.

(Continued)

*Primary Examiner* — Dhaval Patel
(74) *Attorney, Agent, or Firm* — Eschweiler & Associates, LLC

(57) ABSTRACT

A transmitter comprises a baseband signal path, which is designed to provide a first baseband signal having an in-phase component and a quadrature component in a first mode of the transmitter and to provide a second baseband signal having an amplitude component and a phase component in a second mode of the transmitter; an oscillator circuit, which is designed to provide an oscillator signal, wherein the oscillator circuit is furthermore designed to provide the oscillator signal as an unmodulated signal in the first mode and to provide the oscillator signal as a modulated signal in the second mode, wherein a modulation of the oscillator signal in the second mode is based on the phase component of the second baseband signal; and a radio-frequency digital-to-analogue converter (RF-DAC), which is designed to receive the oscillator signal, the first baseband signal and the amplitude component of the second baseband signal, wherein the RF-DAC is furthermore designed to provide the vector-modulated RF output signal on the basis of the first baseband signal and the oscillator signal in the first mode and to provide the polar-modulated RF output signal on the basis of the amplitude component of the second baseband signal and the oscillator signal in the second mode.

21 Claims, 18 Drawing Sheets

(56) References Cited

U.S. PATENT DOCUMENTS

| | | |
|---|---|---|
| 5,781,035 A | 7/1998 | Tashibu |
| 5,847,623 A | 12/1998 | Hadjichristos |
| 5,939,931 A | 8/1999 | Noro |
| 6,259,901 B1 | 7/2001 | Shinomiya et al. |
| 6,546,044 B1 | 4/2003 | Dent |
| 7,176,910 B2 | 2/2007 | Tsuchi |
| 7,233,165 B2 | 6/2007 | Jordy |
| 7,248,115 B2 | 7/2007 | Nishimura |
| 7,460,612 B2 | 12/2008 | Eliezer et al. |
| 7,471,107 B1 | 12/2008 | Fortin et al. |
| 7,609,779 B2 | 10/2009 | Wagh et al. |
| 7,808,841 B2 | 10/2010 | Choi et al. |
| 8,179,109 B2 | 5/2012 | Tang et al. |
| 8,565,344 B2 * | 10/2013 | Kitamura et al. ............ 375/298 |
| 2001/0024133 A1 | 9/2001 | Killat et al. |
| 2002/0057082 A1 | 5/2002 | Hwang |
| 2003/0002594 A1 | 1/2003 | Harel et al. |
| 2003/0054779 A1 | 3/2003 | Losser et al. |
| 2003/0117209 A1 | 6/2003 | Tsuchiya et al. |
| 2004/0095976 A1 | 5/2004 | Bowler et al. |
| 2004/0155892 A1 | 8/2004 | Tsuchi |
| 2005/0190856 A1 | 9/2005 | Kroebel et al. |
| 2006/0023518 A1 | 2/2006 | Iwata |
| 2006/0057991 A1 | 3/2006 | Behzad et al. |
| 2006/0170495 A1 | 8/2006 | Stephelbauer et al. |
| 2006/0220685 A1 | 10/2006 | Jordy |
| 2007/0004351 A1 | 1/2007 | Dekker |
| 2007/0126500 A1 | 6/2007 | Mattisson et al. |
| 2008/0299919 A1 | 12/2008 | Mow et al. |
| 2009/0067278 A1 | 3/2009 | Choi et al. |
| 2009/0130993 A1 | 5/2009 | Rofougaran et al. |
| 2010/0188920 A1 | 7/2010 | Futatsuyama et al. |
| 2010/0195765 A1 | 8/2010 | Lin et al. |
| 2011/0133841 A1 | 6/2011 | Shifrin |
| 2011/0170885 A1 | 7/2011 | Cho et al. |
| 2011/0181264 A1 | 7/2011 | Aiura |
| 2011/0188604 A1 | 8/2011 | Wagner |
| 2011/0193543 A1 | 8/2011 | Nguyen |
| 2011/0298541 A1 | 12/2011 | Shi |
| 2012/0115426 A1 | 5/2012 | Andrys et al. |
| 2012/0213237 A1 | 8/2012 | Mactaggart |
| 2013/0088473 A1 | 4/2013 | Tsuchi |
| 2013/0127530 A1 | 5/2013 | Ni et al. |
| 2013/0154737 A1 | 6/2013 | Shu |
| 2014/0063639 A1 | 3/2014 | Dean |

OTHER PUBLICATIONS

U.S. Appl. No. 13/837,986, filed Mar. 15, 2013. 39 Pages.

Alavi, M.S.; Staszewski, R.B.; De Vreede, L. C N; Long, J.R., "Orthogonal summing and power combining network in a 65-nm all-digital RF I/Q modulator," Radio-Frequency Integration Technology (RFIT), 2011 IEEE International Symposium on Radio-Frequency Integration Technology, pp. 21,24, Nov. 30-Dec. 2, 2011. 4 Pages.

Staszewski, R.B.; Alavi, M.S., "Digital I/Q RF transmitter using time-division duplexing," Symposium on Radio-Frequency Integration Technology (RFIT), 2011 IEEE International pp. 165,168, Nov. 30-Dec. 2, 2011. 4 Pages.

Office Action Dated May 30, 2014 U.S. Appl. No. 13/837,986.

Non Final Office Action Dated Sep. 22, 2014 U.S. Appl. No. 13/834,736.

* cited by examiner

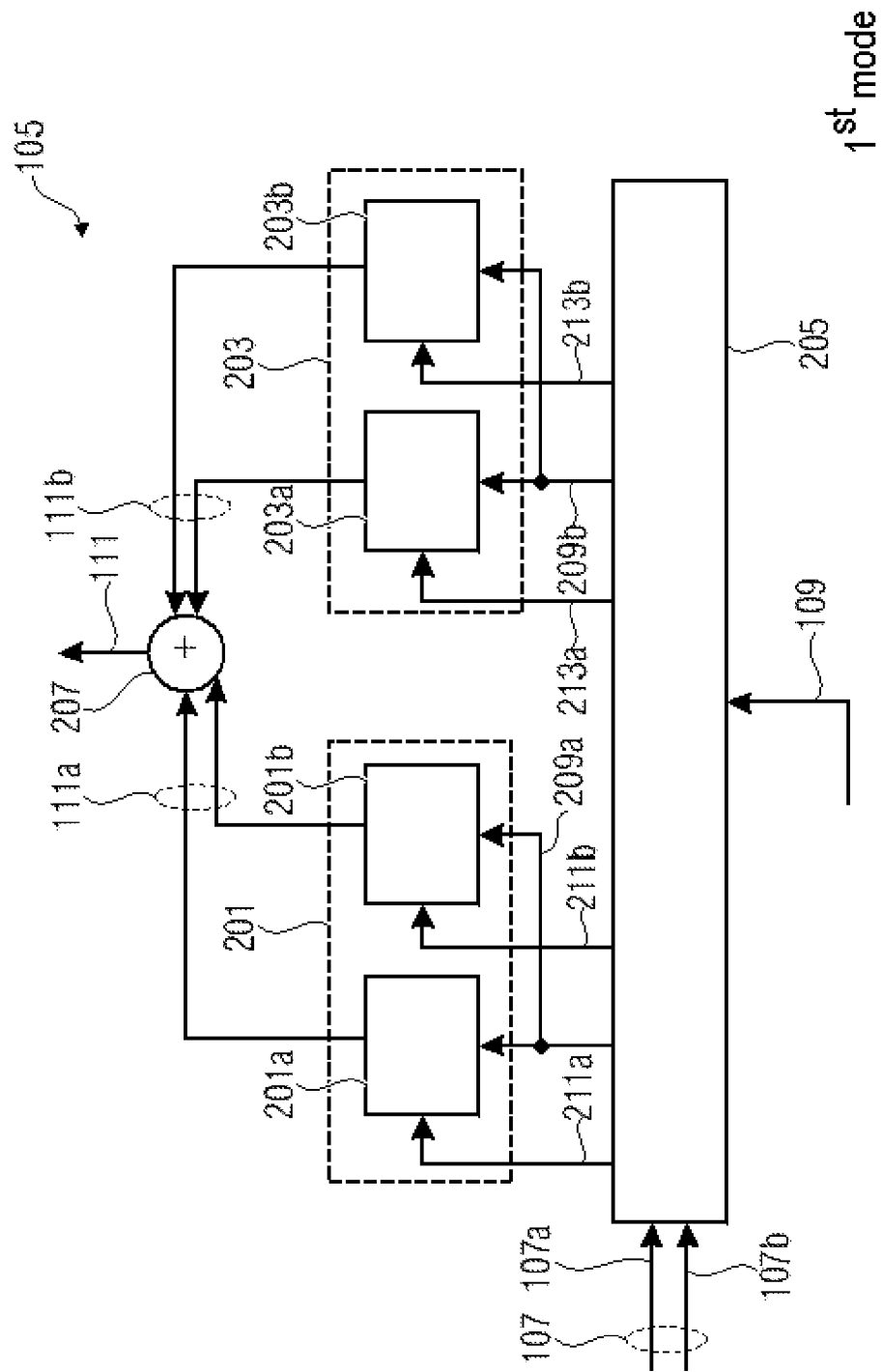

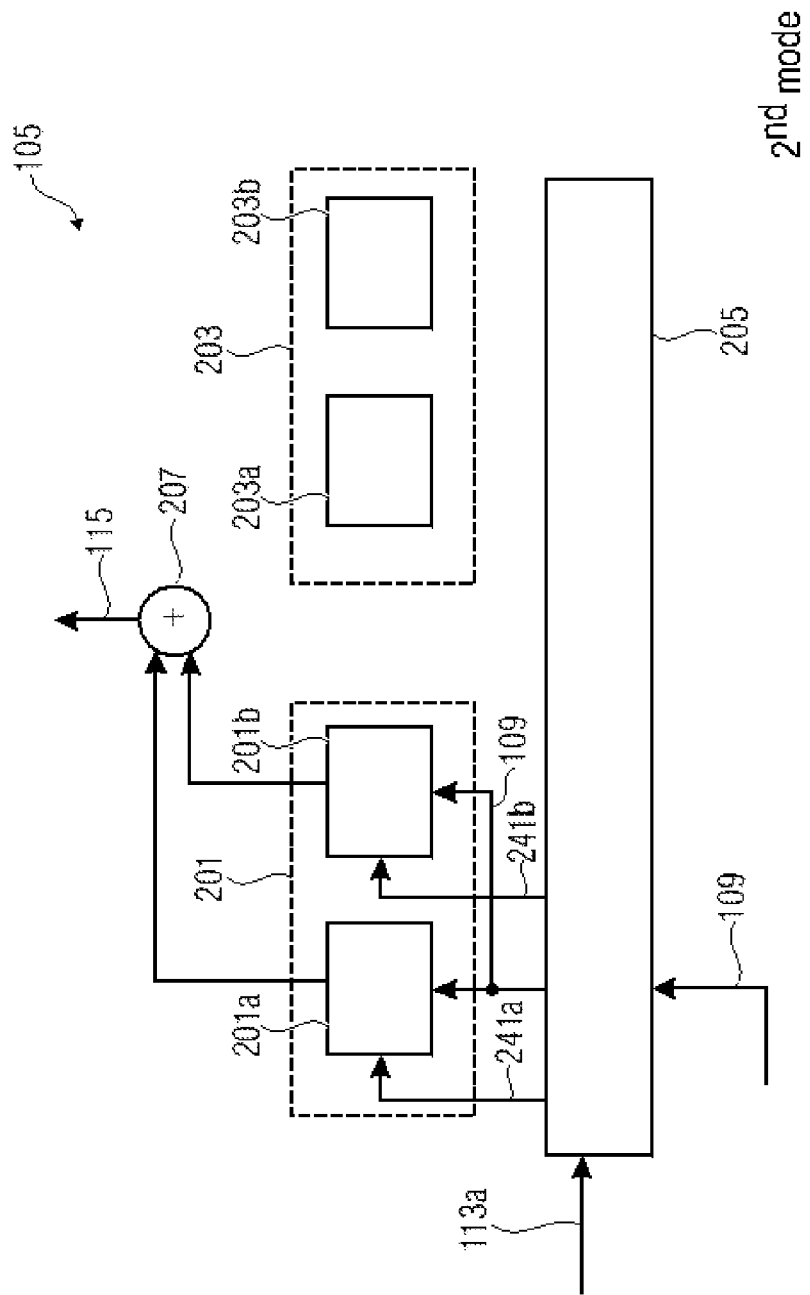

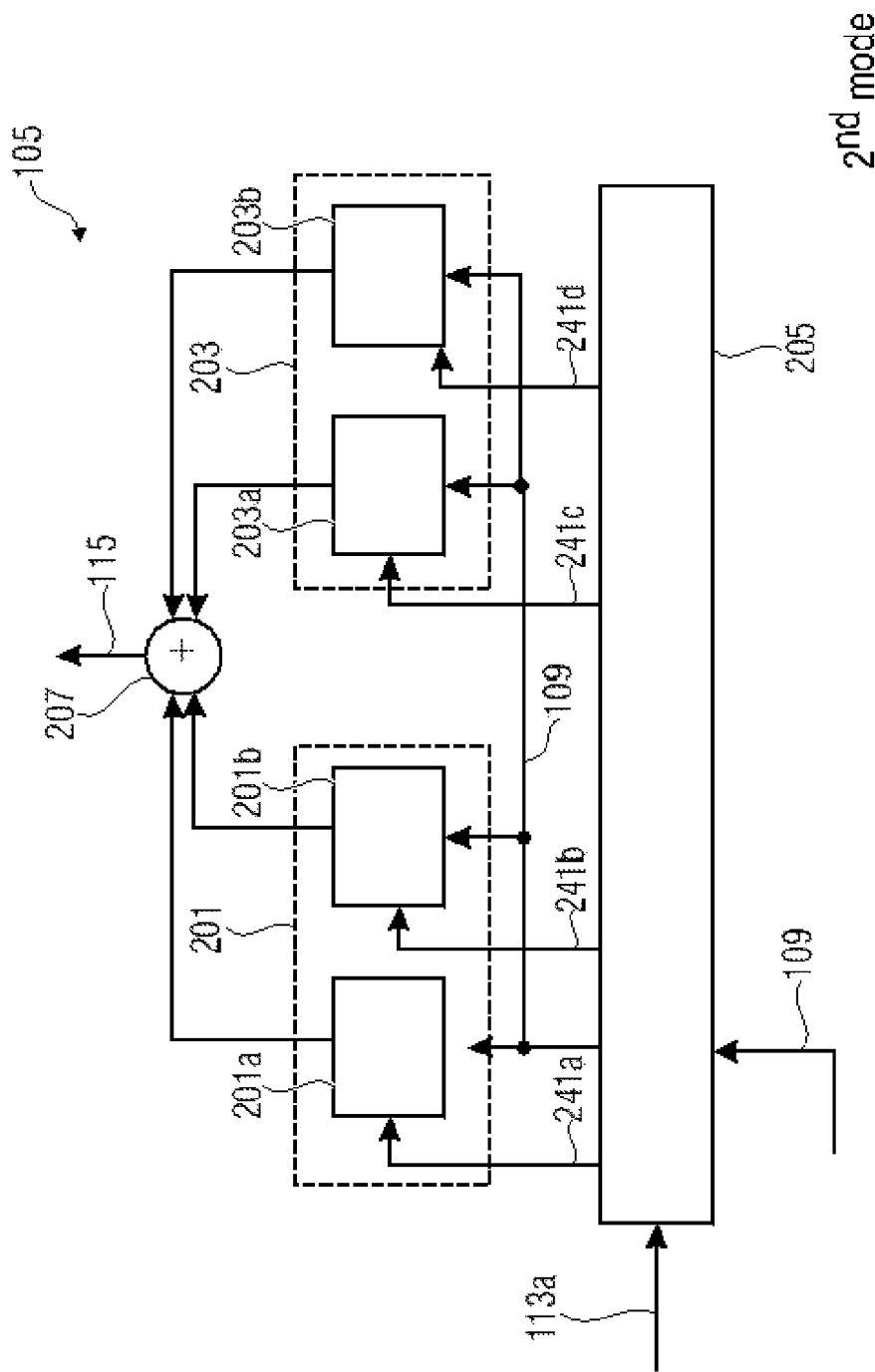

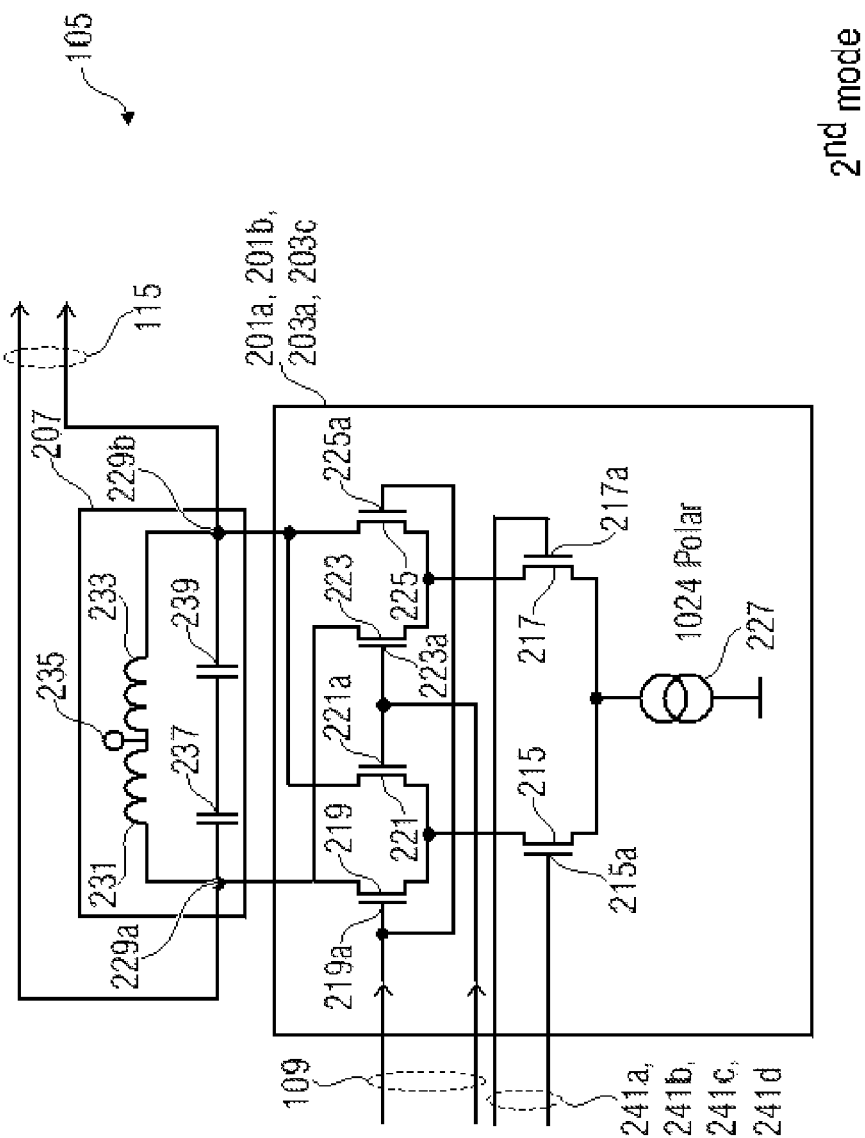

TRANSMITTERS AND METHODS

REFERENCE TO RELATED APPLICATIONS

This application claims priority to U.S. application No. 61/613,102 filed on Mar. 20, 2012, German patent application number DE 10 2012 2044 51.5 filed on Mar. 20, 2012, German patent application number DE 10 2012 2044 50.7 filed on Mar. 20, 2012, and German patent application number DE 10 2012 2044 48.5 filed on Mar. 20, 2012.

FIELD

Exemplary embodiments of the present invention relate to a transmitter. Further exemplary embodiments of the present invention relate to a method for providing a vector-modulated RF output signal in a first mode and a polar-modulated RF output signal in a second mode.

BACKGROUND

Vector modulators are used for transferring a digital baseband signal to a radio-frequency carrier. A modulated radio-frequency output signal is derived by adding output signals from two doubly balanced mixers which are controlled with the aid of a quadrature carrier signal.

Furthermore, polar modulators can be used for generating a modulated radio-frequency output signal, wherein the phase of such a modulated RF signal (RF—radio frequency) is modulated with the aid of a DPLL (digital phase locked loop) and the amplitude of such a modulated RF signal is modulated with the aid of a radio-frequency DAC mixer (DAC—digital-to-analogue converter).

SUMMARY

It is an object of exemplary embodiments of the present invention to provide a concept for a more efficient transmitter.

This object is achieved by means of the transmitters according to Claims 1 and 20 and by means of the methods according to Claims 22 and 23.

Exemplary embodiments of the present invention relate to a transmitter comprising a baseband signal path, which is designed to provide a first baseband signal having an in-phase component and a quadrature component in a first mode of the transmitter, and to provide a second baseband signal having a phase component and an amplitude component in a second mode of the transmitter.

Furthermore, the transmitter comprises an oscillator circuit, which is designed to provide an oscillator signal, to provide the oscillator signal as an unmodulated signal in the first mode and to provide the oscillator signal as a modulated signal in the second mode, wherein a modulation of the oscillator signal in the second mode is based on the phase component of the second baseband signal.

Furthermore, the transmitter comprises an RF-DAC (radio-frequency digital-to-analogue converter), which is designed to receive the oscillator signal, the first baseband signal and the amplitude component of the second baseband signal, and which is designed to provide a vector-modulated RF output signal on the basis of the first baseband signal and the oscillator signal in the first mode and to provide a polar-modulated RF output signal on the basis of the amplitude component of the second baseband signal and the oscillator signal in the second mode.

Further exemplary embodiments of the present invention relate to a transmitter comprising an RF-DAC (radio-frequency digital-to-analogue converter). The RF-DAC is designed to provide a vector-modulated RF output signal on the basis of a first baseband signal in a first mode of the transmitter and to provide a polar-modulated RF output signal on the basis of a second baseband signal in the second mode of the transmitter. The RF-DAC has a plurality of mixer cells for providing the vector-modulated RF output signal in the first mode and the polar-modulated RF output signal in the second mode. The RF-DAC is designed in such a way that at least one portion of the plurality of mixer cells which are used for supplying the vector-modulated RF output signal in the first mode are also used in the second mode for providing the polar-modulated RF output signal.

Further exemplary embodiments of the present invention relate to a method and a computer program for providing a vector-modulated RF output signal in a first mode and a polar-modulated RF output signal in a second mode.

BRIEF DESCRIPTION OF THE DRAWINGS

Exemplary embodiments of the present invention are described in detail below with reference to the accompanying drawings, in which:

FIG. 2a shows a schematic block diagram of an RF-DAC and how the latter can be used in the transmitter from FIGS. 1a and 1b in the first mode of the transmitter;

FIG. 2d shows a schematic block diagram of one possible implementation for the second mode of the RF-DAC shown in FIG. 2a;

FIG. 2g shows, in a schematic block diagram, another possible implementation for the second mode of the RF-DAC shown in FIG. 2a;

FIG. 2i shows, in a schematic diagram, a simplified illustration of a mixer cell which is used in the second mode, on the basis of the other implementation of the RF-DAC shown in FIG. 2g;

DETAILED DESCRIPTION

Before exemplary embodiments of the present invention are described in greater detail below, it is pointed out that the same elements or functionally identical elements are provided with the same reference signs, and that a repeated description for elements provided with the same reference signs has been omitted. Consequently, descriptions for elements having the same reference signs are mutually interchangeable.

Figure 1A:
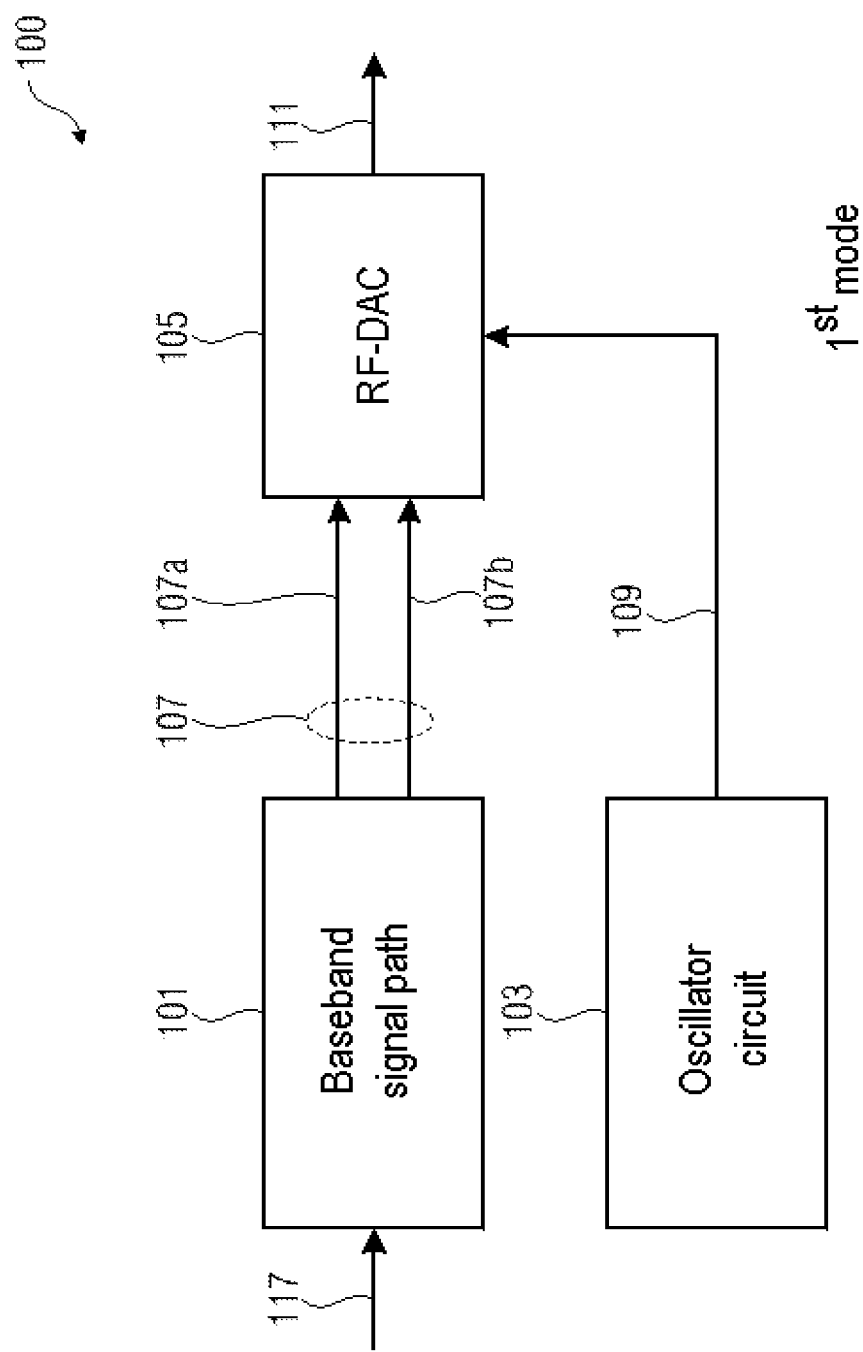
FIG. 1a shows a schematic block diagram of a transmitter in accordance with one exemplary embodiment of the present invention in a first mode.
Figure 1B:
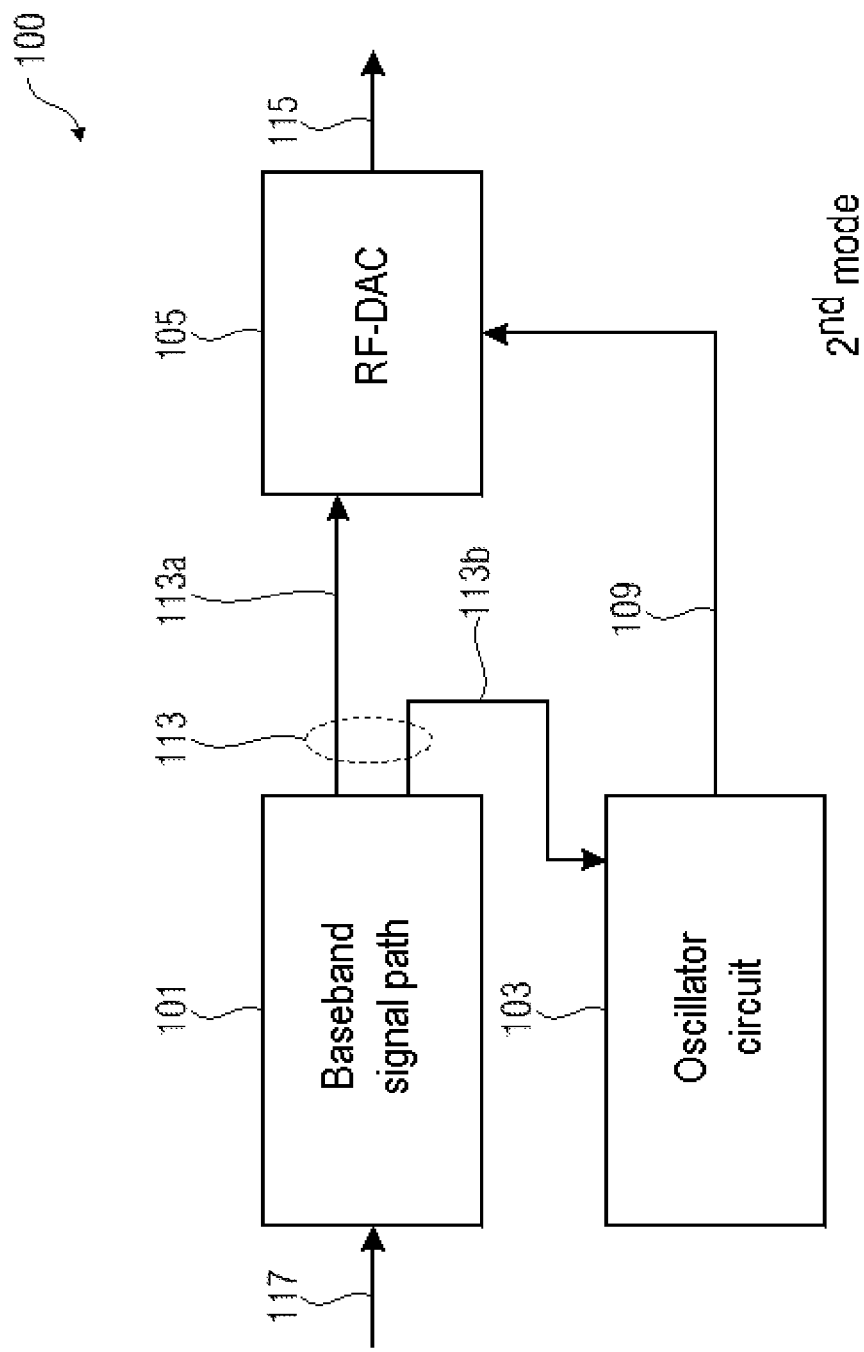
FIG. 1b shows another schematic block diagram of the transmitter 100 from FIG. 1a in a second mode.

FIGS. 1a and 1b show schematic block diagrams of a transmitter 100 in accordance with one exemplary embodiment of the present invention.

FIG. 1a shows the transmitter 100 in a first mode, in which said transmitter is designed to provide a vector-modulated RF output signal, and FIG. 1b shows the transmitter 100 in a second mode, in which said transmitter is designed to provide a polar-modulated RF output signal.

The transmitter 100 comprises a baseband signal path 101, an oscillator circuit 103 and a radio-frequency digital-to-analogue converter (RF-DAC) 105.

The baseband signal path 101 is designed to provide a first baseband signal 107 having an in-phase component 107a and a quadrature component 107b in the first mode of the transmitter 100. The oscillator circuit 103 is designed to provide an oscillator signal 109. Furthermore, the oscillator circuit 103 is designed to provide the oscillator signal 109 as an unmodulated signal in the first mode of the transmitter 100. The RF-DAC 105 is designed to receive the first baseband signal 107 and the oscillator signal 109, and is furthermore designed to provide, in the first mode, a vector-modulated RF output signal 111, on the basis of the first baseband signal 107 and the oscillator signal 109 (as an unmodulated signal).

Furthermore (as is shown in FIG. 1b), the baseband signal path 101 is designed to provide a second baseband signal 113 having an amplitude component 113a and a phase component 113b in the second mode of the transmitter 100. The oscillator 103 is furthermore designed to provide the oscillator signal 109 as a modulated signal in the second mode of the transmitter 100, wherein a modulation of the oscillator signal 109 in the second mode is based on the phase component 113b of the second baseband signal 113 (provided by the baseband signal path 101).

The RF-DAC 105 is furthermore designed to receive the amplitude component 113a of the second baseband signal 113, and is furthermore designed to provide, in the second mode of the transmitter 100, a polar-modulated RF output signal 115, on the basis of the amplitude component 113a of the second baseband signal 113 and of the oscillator signal 109 (a modulation thereof is based on the phase component 113b of the second baseband signal 113).

The transmitter 100 can be designed to switch from the first mode, shown in FIG. 1a, into the second mode, shown in FIG. 1b, or from the second mode into the first mode.

Consequently, the transmitter 100 shown in FIGS. 1a and 1b is designed to perform a vector modulation (also called IQ modulation) in the first mode and a polar modulation in the second mode. To put it another way, exemplary embodiments of the present invention make possible a configurable TX (transmit) architecture with both polar modulation and IQ modulation.

Furthermore, as can be seen from FIGS. 1a and 1b, one and the same RF-DAC 105 and also one and the same oscillator circuit 103 can be used for the vector modulation (in the first mode) and the polar modulation (in the second mode). Consequently, it is a fundamental concept of exemplary embodiments of the present invention that one and the same transmitter 100 can be used for both a polar modulation and a vector modulation. Consequently, it is an advantage of the transmitter 100 that it combines the advantages of polar modulation and vector modulation in one transmitter, without needing to have a dedicated oscillator circuit and/or an RF-DAC for each modulation scheme.

As an example, for a modulation bandwidth to a given, predetermined bandwidth threshold (e.g. 5 MHz, 20 MHz or 50 MHz), the transmitter 100 (and therefore also the RF-DAC 105) can operate as a polar modulator (in the second mode) and, for a modulation width above said predetermined bandwidth threshold (e.g. for the case of an LTE (long term evolution) carrier aggregation), the transmitter 100 (and therefore also the RF-DAC 105) can operate as an IQ or vector modulator (in the first mode). Therefore, the baseband signal path 101 is also configurable between these two modes. As an example, the baseband signal path 101 can have a CORDIC (COordinate Rotation Digital Computer) module, which can be used only in the second mode, while it is bypassed in the first mode. One advantage is a lower current consumption for the 2G/3G and 4G standards predominantly in use, as a result of using a polar modulation (in the second mode).

A further advantage of this example is that the problems which occur in particular for polar modulation systems having a high bandwidth, that the modulation of the DCO and the delay between the amplitude component and the phase component become critical, can be prevented by switching into the vector modulation mode for these high bandwidths. Consequently, these problems no longer occur since, in the vector modulation mode, the oscillator signal 109 is to be provided as an unmodulated signal.

As a further example, for a single-antenna transmission mode, the transmitter 100 can operate in the second mode (as a polar modulator), wherein the phase-modulated oscillator signal 109 is to be provided by the oscillator circuit 103, e.g. with a phase-modulated DCO (digitally controlled oscillator). For a multi-antenna transmission mode, the transmitter 100 can operated in the first mode (as a vector modulator), wherein the unmodulated oscillator signal 109 is provided by the oscillator circuit 103. One advantage of this example is an expected lower current consumption for the multi-antenna transmission mode (e.g. MIMO) as a result of using the IQ or vector modulation mode, while a low current consumption in the single-transmission mode predominantly in use is furthermore maintained using the polar modulation mode (the second mode).

In contrast thereto, conventional systems using only a polar modulation would require a plurality of synthesizers for generating the different transmission signals, which usually leads to a higher current consumption for the polar modulator concept in comparison with the vector modulator concept.

In accordance with some exemplary embodiments of the present invention, the baseband signal path 101 can be designed to receive (digital) data signals 117, and can be designed to provide the first baseband signal 107 in the first mode and the second baseband signal 113 in the second mode on the basis of said data signals 117. Consequently, the data signals 117 can be independent of the current mode of the transmitter 100, and the baseband signal path 101 can supply the first baseband signal 107 having the in-phase component 107a and the quadrature component 107b if the transmitter 100 is presently in the first mode, or can supply the second baseband signal 113 having the amplitude component 113a and the phase component 113b if the transmitter 100 is at present in the second mode.

As has already been mentioned, the mode of the transmitter 100 can be selected (e.g. by the transmitter itself) depending on a resulting modulation bandwidth (of the resulting RF output signal 111, 115) and/or the number of RF output signals which are intended to be provided simultanteously (e.g. single-antenna mode or multi-antenna mode).

A frequency of the oscillator signal 109 in the first mode and the second mode can be selected depending on the communication standard which is required for the RF output signals, and can be e.g. a carrier frequency of such a communication standard.

In the case of the vector modulation mode or first mode of the transmitter 100, the oscillator signal 109 is provided as an unmodulated signal, e.g. having a fixed RF-LO (local oscillator) frequency. In the case of the polar modulator mode or the second mode of the transmitter 100, the oscillator signal 109 is provided as a modulated signal, e.g. as a phase-modulated LO signal (the carrier frequency mentioned being superposed with the phase modulation, determined by the phase component 113b of the second baseband signal 113).

FIG. 2a shows, in a schematic block diagram, one possible implementation of the RF-DAC 105 of the transmitter 100.

In the example shown in FIG. 2a, the RF-DAC 105 has a plurality of mixer cells 201a, 201b, 203a, 203b. Furthermore, the RF-DAC 105 has a decoder 205. Furthermore, the RF-DAC 105 has a common summing terminal 207 (e.g. an RF balun 207). The mixer cells 201a, 201b, 203a, 203b can be subdivided into a first sub-plurality 201 of mixer cells, having the mixer cells 201a, 201b, and a second sub-plurality 203 of mixer cells, having the mixer cells 203a, 203b.

The first sub-plurality 201 of mixer cells 201a, 201b and the second sub-plurality 203 of mixer cells 203a, 203b, can be disjoint or, to put it another way, a mixer cell contained in the first sub-plurality 201 is not contained in the second sub-plurality 203, and a mixer cell contained in the second sub-plurality 203 is not contained in the first sub-plurality 201.

In the example shown in FIG. 2a, the RF-DAC 105 is in the first mode, in which the RF-DAC 105 provides the vector-modulated RF output signal 111 on the basis of the first baseband signal 107 (having the in-phase component 107a and the quadrature component 107b) and the oscillator signal 109 (which is an unmodulated signal).

Consequently, the mixer cells 201a, 201b of the first sub-plurality 201 can be designated as in-phase mixer cells and the mixer cells 203a, 203b of the second sub-plurality 203 can be designated as quadrature mixer cells. The in-phase mixer cells 201a, 201b can be designed to provide an in-phase component 111a of the vector-modulated RF output signal 111, and the quadrature mixer cells 203a, 203b can be designed to provide a quadrature component 111b of the vector-modulated RF output signal 111. The mixer cells 201a, 201b, 203a, 203b are coupled to the common summing terminal 207, at which output signals of the mixer cells 201a, 201b, 203a, 203b are superposed in order to obtain the vector-modulated output signal 111.

To put it another way, the mixer cells 201a, 201b, 203a, 203b are designed to provide the vector-modulated (RF) output signal 111 in the first mode of the transmitter 100.

The decoder 205 is designed to provide for the in-phase mixer cells 201a, 201b on the basis of the oscillator signal 109 in the first mode an in-phase oscillator signal 209a (which is based on the oscillator signal 109), which is identical for all mixer cells of the sub-plurality 201 of mixer cells. Consequently, the in-phase oscillator signal 209a is identical for all mixer cells 201a, 201b of the first sub-plurality 201 of mixer cells.

Furthermore, the decoder 205 is designed to provide for the quadrature mixer cells 203a, 203b in the first mode a quadrature oscillator signal 209b (which is based on the oscillator signal 109). Consequently, the quadrature oscillator signal 209b is identical for all mixer cells 203a, 203b of the second sub-plurality 203 of mixer cells.

The in-phase oscillator signal 209a and the quadrature oscillator signal 209b can be phase-shifted relative to one another.

As an example, either the in-phase oscillator signal 209a or the quadrature oscillator signal 209b can be identical to the oscillator signal 109.

Furthermore, the decoder 205 is designed to determine in the first mode for each in-phase mixer cell 201a, 201b an assigned vector modulation control signal 211a, 211b on the basis of the in-phase component 107a of the first baseband signal 107 (for example an in-phase control signal 211a, 211b). Furthermore, the decoder 205 is designed to determine in the first mode for each quadrature mixer cell 103a, 103b an assigned vector modulation control signal 213a, 213b on the basis of the quadrature component 107b of the first baseband signal 107 (for example a quadrature control signal 213a).

Each mixer cell 201a, 201b, 203a, 203b can be designed to mix its assigned vector modulation control signal 211a, 211b, 213a, 213b with its assigned in-phase oscillator signal 209a or quadrature oscillator signal 209b in order to determine a mixer cell output signal. These mixer cell output signals of the different mixer cells 201a, 201b, 203a, 203b can be summed or superposed at the common summing terminal 207 in order to determine the vector-modulated RF output signal 111.

Figure 2B:
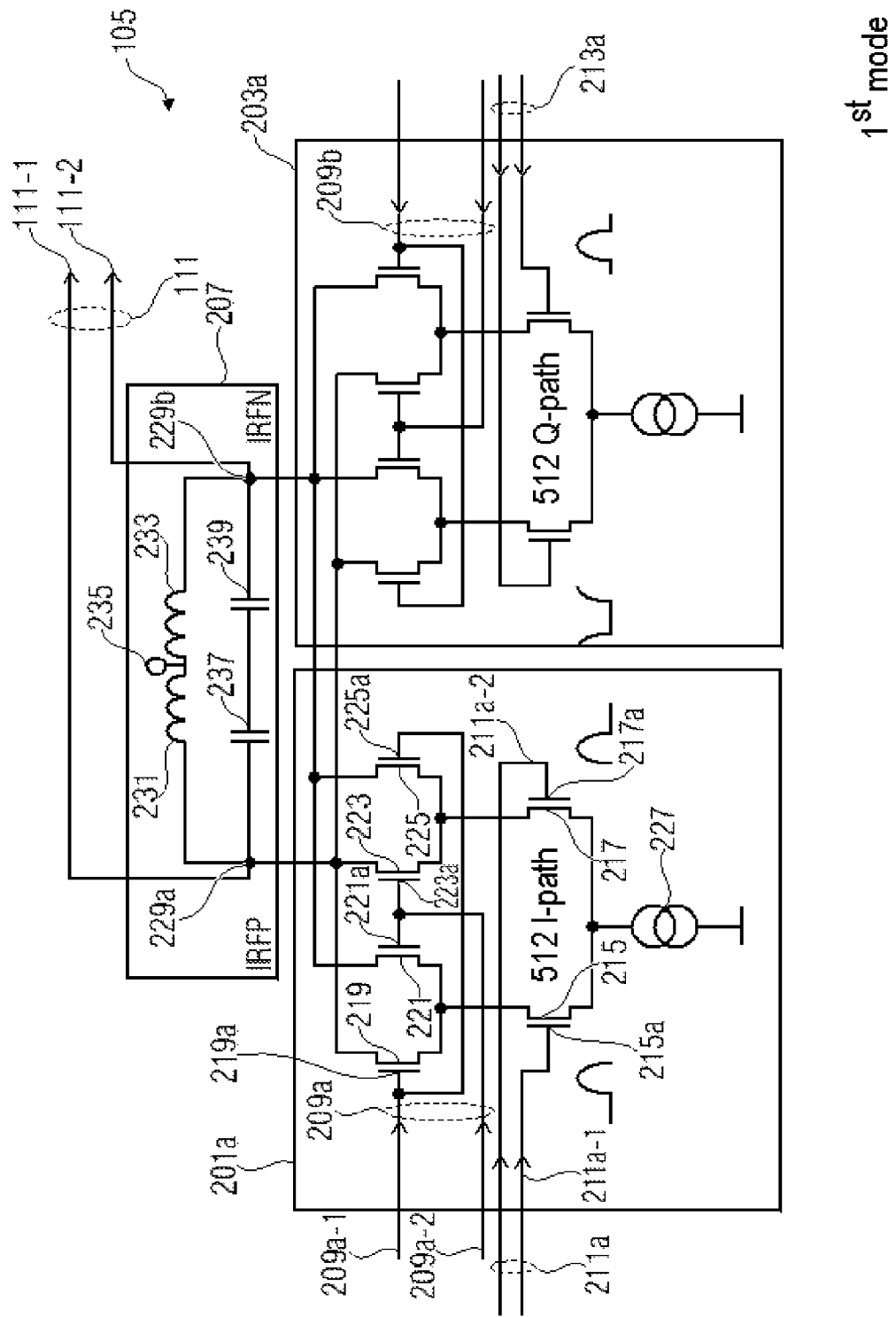
FIG. 2b schematically shows one possible implementation of the mixer cells from the RF-DAC shown in FIG. 2a, and how control signals and oscillator signals can be provided for the mixer cells in the first mode.

FIG. 2b shows, in a circuit diagram, one possible implementation of the mixer cells 201a, 203a of the RF-DAC 105, shown in FIG. 2a. Furthermore, FIG. 2b shows how the oscillator signals 209a, 209b and the control signals 211a, 213a can be provided for the mixer cells 201a, 203a in the first mode.

FIG. 2b shows only the in-phase mixer cell 201a and the quadrature mixer cells 203a since further mixer cells of the RF-DAC 105 can have the same structure as the mixer cells 201a, 203b shown in FIG. 2b.

As can be seen from FIG. 2b, the in-phase oscillator signal 209a and the quadrature oscillator signal 209b can be provided as differential signals by the decoder 205 (not shown in FIG. 2b) or even by the oscillator circuit 103 (not shown in FIG. 2b). The same applies to the in-phase control signal 211a and the quadrature control signal 213a, which can be provided as differential signals by the decoder 205. Consequently, the vector-modulated RF output signal 111 can also be provided as a differential signal by the RF-DAC 105.

Nevertheless, some or all of the abovementioned signals can also be provided as single-ended signals. To put it another way, in accordance with further exemplary embodiments of the present invention, while the RF-DAC 105 shown in FIG. 2b is based on an implementation of a differential signal, the RF-DAC 105 can also be based on a single-ended implementation.

As can be seen in FIG. 2b, each mixer cell 201a, 203a has a controllable current source or forms the same, which is controlled with the aid of the in-phase oscillator signal 209a and the vector modulation control signal 211a (in-phase mixer cell 201a) or with the aid of the quadrature oscillator signal 209b and the vector modulation control signal 213a (quadrature mixer cell 203).

Since the structure of the in-phase mixer cell 201a and that of the quadrature mixer cell 203a are identical, only the structure of the in-phase mixer cell 201a is described in detail below. This description also applies to the quadrature mixer cell 203a and the other mixer cells of the RF-DAC 105.

The in-phase mixer cell 201a has a first transistor 215, a second transistor 217, a third transistor 219, a fourth transistor 221, a fifth transistor 223 and a sixth transistor 225. Furthermore, the in-phase mixer cell 201a can have a current source 227. In accordance with further exemplary embodiments, said current source 227 can also be a common current source of the RF-DAC 105 to which all the mixer cells are coupled. Nevertheless, in the example shown in FIG. 2b, each mixer cell has its own current source 227.

A drain-source path of the first transistor 215 is coupled between the current source 227 and drain-source paths of the third transistor 219 and of the fourth transistor 221. A drain-source path of the second transistor 217 is coupled between the current source 227 and drain-source paths of the fifth transistor 223 and of the sixth transistor 225.

A gate terminal 215a of the first transistor 215 is designed to receive a first sub-signal 211a-1 of the (differential) vector modulation control signal 211a. A gate terminal 217a of the second transistor 217 is designed to receive a second sub-signal 211a-2 of the (differential) vector modulation control signal 211a.

A gate terminal 219a of the third transistor 219 and the gate terminal 225a of the sixth transistor 225 are designed to receive a first sub-signal 209a-1 of the (differential) in-phase oscillator signal 209a. A gate terminal 221a of the fourth transistor 221 and a gate terminal 223a of the fifth transistor 223 are designed to receive a second sub-signal 209a-2 of the (differential) in-phase oscillator signal 209a.

Furthermore, the drain-source paths of the third transistor 219 and of the fifth transistor 223 are coupled to a first differential output node 229a of the common summing terminal 207 (also designated as IRFP). The drain-source paths of the fourth transistor 221 and of the sixth transistor 225 are coupled to a second differential output node 229b (also designated as IRFN) of the common summing terminal 207. The common summing terminal 207 is designed to provide a first sub-signal 111-1 of the (differential) vector-modulated RF output signal 111 at the first differential output node 229a and a second sub-signal 111-2 of the (differential) vector-modulated RF output signal 111 at the second differential output node 229b.

In general, the common summing terminal 207 can have or form an RF balun. In the example shown in FIG. 2, the commun summing terminal 207 has a first inductance 231 and a second inductance 233, wherein a first terminal of the first inductance 231 is coupled to the first differential output node 229a of the common summing terminal 207, and a second terminal of the first inductance 231 is coupled to a second terminal of the second inductance 233 and to a supply potential terminal 235. A first terminal of the second inductance 233 is coupled to the second differential output node 229b of the common summing terminal 207. Furthermore, the common summing terminal 207 can have a series circuit formed by a first transistor 235 and a second transistor 237, which is coupled between the first differential output node 229a and the second differential output node 229b.

Although field effect transistors are always used in the example described above and in the following circuit diagrams, it is also possible to use other types of transistors, such as e.g. bipolar transistors, in exemplary embodiments of the present invention.

As can be seen from FIG. 2b, the quadrature mixer cell 203a is correspondingly coupled to the common summing terminal 207 in order to achieve the desired mixing of the in-phase component 107a and the quadrature component 107b of the first baseband signal 107, in order to obtain the vector-modulated RF output signal 111 as a result of this mixing.

As an example, the RF-DAC 105 can have 256 of these in-phase mixer cells 101a and 256 of these quadrature mixer cells 203a in order to achieve 512 I-paths and 512 Q-paths.

Figure 2C:
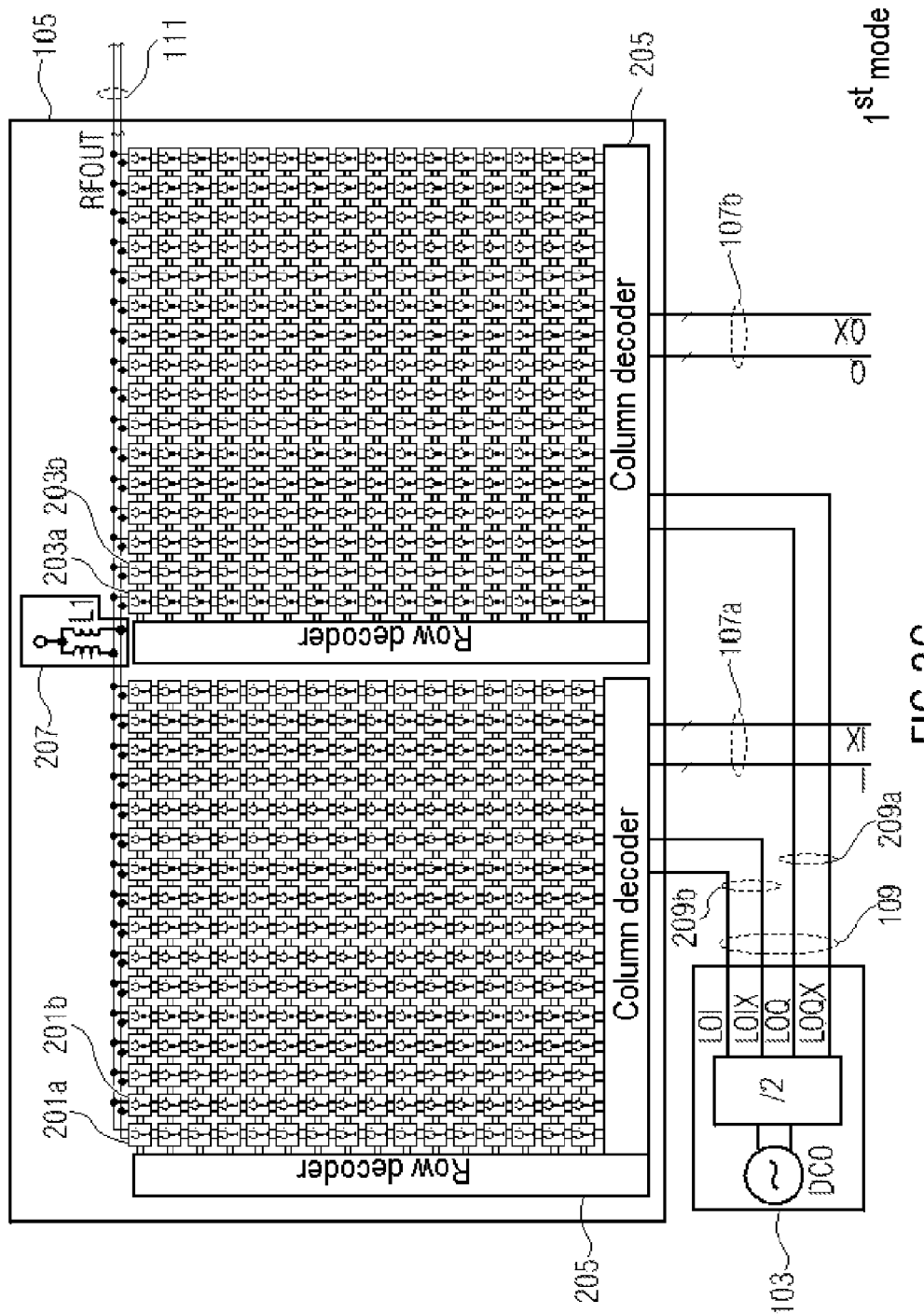
FIG. 2c shows one possible implementation for a complete RF-DAC which can be used in the transmitter shown in FIGS. 1a and 1b, in the first mode.

This is shown in FIG. 2c in an implementation of the RF-DAC 105 having 256 in-phase mixer cells 201a, 201b and 256 quadrature mixer cells 203a, 203b.

Furthermore, as is shown in FIG. 2c, in accordance with further exemplary embodiments of the present invention, the different differential oscillator signals (the in-phase oscillator signal 209a and the quadrature oscillator signal 209b) can already be provided by the oscillator circuit 103 and are distributed in the RF-DAC 105 among their assigned in-phase mixer cells 201a, 201b or quadrature mixer cells 203a, 203b.

Furthermore, as can be seen from FIG. 2c, the RF-DAC 105 can have a first row decoder and a first column decoder for the in-phase mixer cells 201a, 201b and a second row decoder and a second column decoder for the quadrature mixer cells 203a, 203b.

The first row decoder and the first column decoder can be designed to determine a plurality of vector modulation control signals for the in-phase mixer cells 201a, 201b on the basis of the in-phase component 107a. The second row decoder and the second column decoder can be designed to determine a plurality of vector modulation control signals for the quadrature mixer cells 203a, 203b on the basis of the quadrature component 107b.

To put it another way, FIG. 2c shows a digital vector modulator having distributed mixers (the mixer cells 201a, 201b and the mixer cells 203a, 203b) in which the mixing of the carrier signal (of the oscillator signal 109) with the digital baseband signal (the first baseband signal 107) is effected in the digital control circuit (realized by the mixer cells 201a, 201b and 203a, 203b). As an example, the in-phase component 107a and the quadrature component 107b can in each case correspond to a binary output word in response to which the decoder 205 activates or deactivates specific mixer cells and therefore activates or deactivates specific controllable current sources of the mixer cells 201a, 201b, 203a, 203b. The digital-to-analogue conversion and the radio-frequency mixing are effected in each individual mixer cell (or element) of the two cell arrays, shown in FIG. 2c.

As was mentioned in conjunction with FIG. 1, the RF-DAC 105 is designed to provide, in the second mode of the transmitter 100, the polar-modulated RF output signal 115 on the basis of the oscillator signal 109 (which is a modulated signal) and the amplitude component 113a of the second baseband signal 113. Consequently, different possibilities of the implementation of the RF-DAC 105 for the second mode of the transmitter 100 are described below, wherein both implementations have the same features insofar as at least some of the mixer cells of the RF-DAC 105 are used in the first mode for providing the vector-modulated RF output signal 111 and are also used in the second mode for providing the polar-modulated RF output signal 115.

Figure 2E:
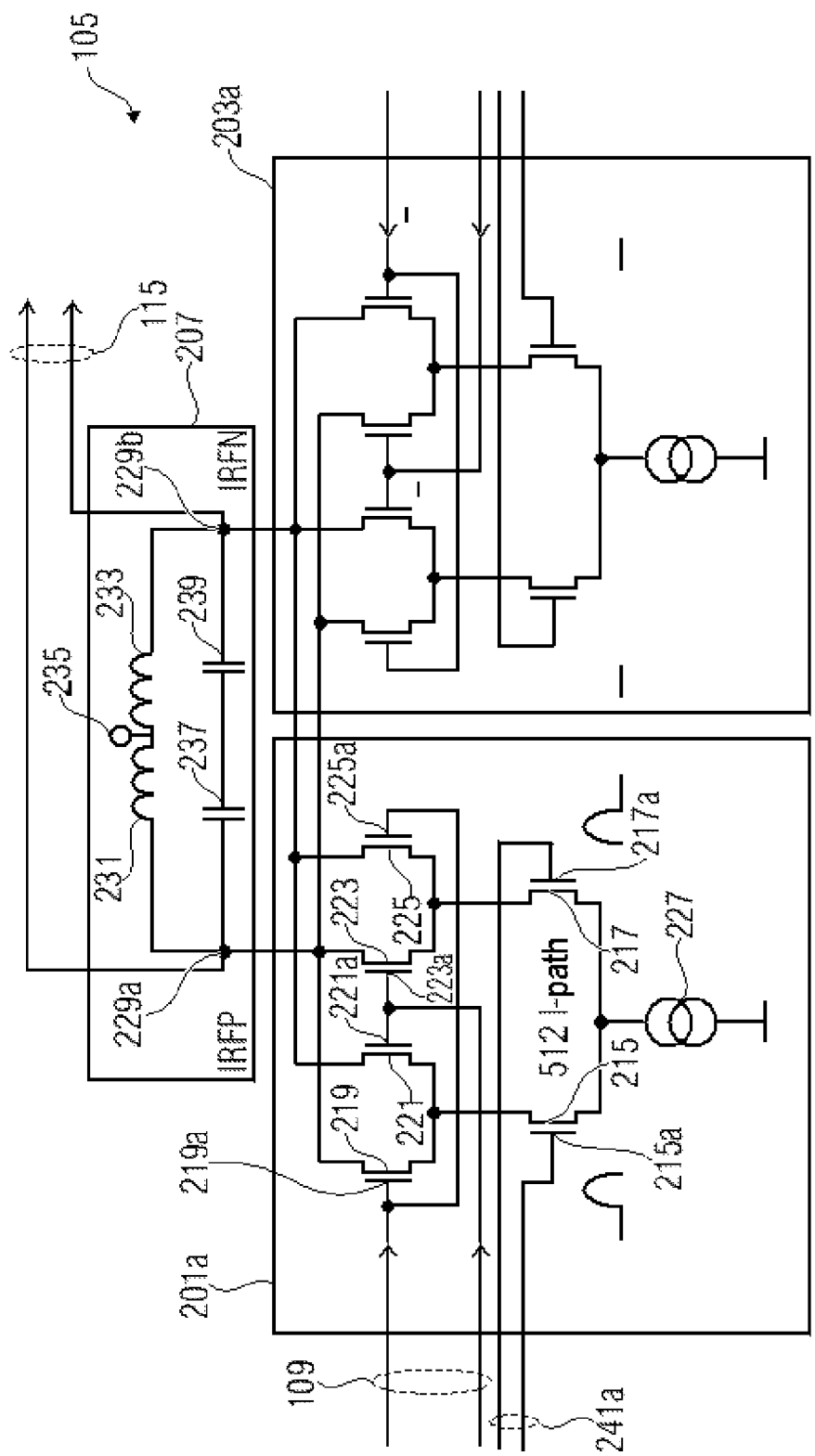
FIG. 2e shows, on the basis of the circuit diagram from FIG. 2b, how oscillator signals and control signals can be provided for the mixer cells in the second mode, on the basis of the implementation of the RF-DAC shown in FIG. 2d.

In the first example, for an implementation of the RF-DAC 105 which is described in FIGS. 2d-2e, only a portion of the mixer cells of the RF-DAC 105 which are used for providing the vector-modulated RF output signal 111 in the first mode are used for providing the polar-modulated RF output signal 115 in the second mode.

In the example described below, the in-phase mixer cells (e.g. the in-phase mixer cells 201a, 201b) of the RF-DAC 105 are used for providing the polar-modulated RF output signal 115. In accordance with further exemplary embodiments, instead of using the in-phase mixer cells, it is also possible to use the quadrature mixer cells (e.g. the quadrature mixer cells 203a, 203b) for providing the polar-modulated RF output signal 115. In accordance with further exemplary embodiments, it is also possible, of course, to use only a portion of the in-phase mixer cells or quadrature mixer cells for providing the polar-modulated RF output signal 115.

Since the same RF-DAC 105 is used for providing the vector-modulated RF output signal 111 in the first mode and the polar-modulated RF output signal 115 in the second mode, the structure remains the same (e.g. the mutual connection between the mixer cells of the RF-DAC 105). Usually, the only difference between the first mode and the second mode in the RF-DAC 105 is the function of the decoder 205, which supplies the control signals and the oscillator signals to a plurality of mixer cells 201a, 201b, 203a, 203b.

As can be seen from FIG. 2d, the decoder 205 is designed to receive the amplitude component 113a of the second baseband signal 113 and of the oscillator signal 109 (which is a modulated signal), and is designed to determine, on the basis of the amplitude component 113a, a plurality of polar modulation control signals 241a, 241b for the first sub-plurality 201 of mixer cells 201a, 201b which are used in the first mode for providing the vector-modulated RF output signal 111 and in the second mode for providing the polar-modulated RF output signal 115. Furthermore, the decoder 205 is designed to provide the oscillator signal 109 (or a signal which is based on the oscillator signal 109) for the first sub-plurality of mixer cells 201a, 201b. The oscillator signal 109 provided for the first sub-plurality 201 of mixer cells 201a, 201b can be identical for all mixer cells 201a, 201b of the first sub-plurality 201. In contrast thereto, the decoder 205 can be designed to provide a dedicated polar modulation control signal 241a, 241b for each mixer cell 201a, 201b of the first sub-plurality 201 of mixer cells 201a, 201b, said control signal being assigned to the mixer cells 201a, 201b, depending on the amplitude component 113a, e.g. in such a way that a sum of the output signals of the first sub-plurality 201 of mixer cells 201a, 201b corresponds to the amplitude component 113a.

The decoder 205 can be designed to provide the oscillator signal 109 in the second mode at the same oscillator terminals of the mixer cells 201a, 201b at which said decoder supplies the corresponding oscillator signal (e.g. the in-phase oscillator signal 209a) in the first mode. To put it another way, the decoder 205 is designed to provide the oscillator signal 109 or a signal based on the oscillator signal 109 in the first mode and the second mode at the same oscillator terminal of the mixer cells 201a, 201b which is used in the first mode and the second mode.

The decoder 205 can be designed to provide in the first mode the vector modulation control signals 211a, 211b at the same control terminals of the mixer cells 201a, 201b at which said decoder provides the polar modulation control signal 241a, 241b in the second mode. Furthermore, the decoder 205 can be designed to determine the polar modulation control signal 241a, 241b independently of the phase component 113b of the second baseband signal 113, since the modulation of the oscillator signal 109 is already based on the phase component 113b of the second baseband signal 113.

Furthermore, the decoder 205 can be designed to omit providing any control signals and/or oscillator signals to the second sub-plurality 203 of mixer cells 203a, 203b, since these are not used in the second mode for providing the polar-modulated RF output signal 115. By way of example, the decoder 105 can be designed to apply a potential to the corresponding inputs of the second sub-plurality 203 of mixer cells 201a, 201b in such a way as to minimize a current consumption of these mixer cells 203a, 203b (not used) in said second mode of the transmitter 100.

FIG. 2e shows, on the basis of the circuit diagram from FIG. 2b, how the oscillator signal 109 and the polar modulation control signals 241a, 241b can be provided for the mixer cells 201a, 201b in the second mode, on the basis of the implementation of the RF-DAC 105, shown in FIG. 2d. As described in conjunction with FIG. 2d, only the first sub-plurality 201 of the mixer cells 201a, 201b (in this specific implementation) is used for providing the polar-modulated RF output signal 115. This is shown in FIG. 2e insofar as the in-phase mixer cell 201a uses the oscillator signal 109 and its assigned polar modulation control signal 241a, while input signals of the quadrature mixer cell 203a are selected in such a way that the transistors of the quadrature mixer cell 203a are in a high-impedance state in order to reduce the current consumption of the quadrature mixer cell 203a in the second mode, since it is not used for providing the polar-modulated RF output signal 115. As can be seen from FIG. 2e, the polar modulation control signal 241a is provided as a differential signal at the same gates 215a, 217a at the same transistors 215, 217 as the vector modulation control signal 211a in the first mode. Furthermore, the oscillator signal 109 (which is a modulated signal) is also provided as a differential signal at the same gates 219a, 221a, 223a, 225a of the same transistors 219, 221, 223, 225 of the in-phase mixer cell 201a in the second mode as the in-phase oscillator signal 209a in the first mode.

To summarize, while in the first mode the mixing of the in-phase component and of the quadrature component is finally performed at the common summing terminal 207, in the second mode the mixing of the amplitude component 113a and of the phase component 113b is already effected in the individual mixer cells of the RF-DAC 105. Furthermore, while the transistors 219, 221, 223, 225 receive the in-phase oscillator signal 209a as an unmodulated signal in the first mode, said transistors 219, 221, 223, 225 receive the oscillator signal 109 as a modulated signal (a modulation thereof is based on the phase component 113b of the second baseband signal 113), in the second mode.

As can be seen from FIG. 2e, the RF-DAC 105 can have 256 of such in-phase mixer cells 201a, 201b, which form the first plurality 201 of mixer cells, wherein the resulting polar-modulated RF output signal 115 is a summation at the common summing terminal 207 of all output signals of the first sub-plurality 201 of mixer cells 201a, 201b. In the example shown in FIGS. 2d and 2e, the second sub-plurality 203 of mixer cells 203a, 203b has no influence (apart from a parasitic influence) on the polar-modulated RF output signal 115 in the second mode of the transmitter 100.

To put it another way, FIGS. 2d and 2e show an example in which the RF-DAC 105 (or the modulator 105) is used completely for the first mode and only partly for the second mode, e.g. by the use of the 512 I-mixers.

Figure 2F:
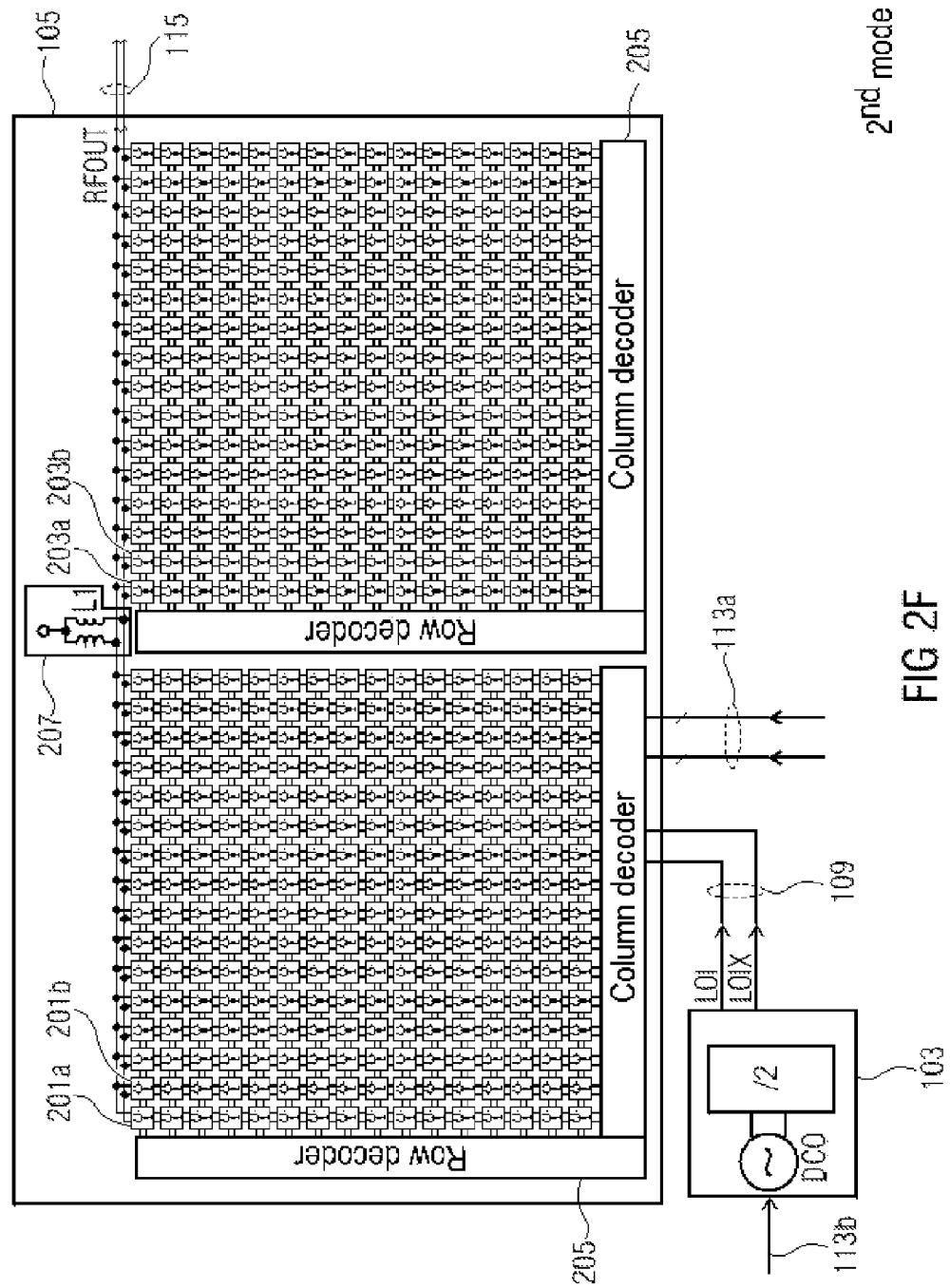
FIG. 2f shows how the control signals and oscillator signals can be provided for the complete RF-DAC, shown in FIG. 2c, in the second mode, on the basis of the implementation of the RF-DAC, described in conjunction with FIG. 2d.

FIG. 2f shows the implementation of the RF-DAC 105 from FIG. 2c in the second mode using the implementation in which only the first sub-plurality 201 of the mixer cells 201a, 201b is used for providing the polar-modulated RF output signal 115. As is shown in FIG. 2f, it suffices to provide the oscillator signal 109 and the amplitude component 113a of the second baseband signal 113 for the first row decoder and for the first column decoder of the decoder 205 for the in-phase mixer cells 201a, 201b. Furthermore, as can be seen from FIG. 2f, the oscillator circuit 103 is designed, in the second mode, to receive the phase component 113b of the second baseband signal 113 and to provide the oscillator signal 109 as a modulated signal on the basis of the phase component 113b. The first row decoder and the first column decoder are designed to provide, on the basis of the amplitude component 113a, the polar modulation control signals 241a, 241b for the mixer cells 201a, 201b for activating, depending on the amplitude component 113a, specific mixer cells of the first sub-plurality 201 of the mixer cells 201a, 201b.

A superposition of the output signals of the activated mixer cells at the common summing terminal 207 is the polar-modulated RF output signal 115 e.g. as a differential signal.

In accordance with further exemplary embodiments, the RF-DAC 205 can be designed to use the first sub-plurality 201 of mixer cells 201a, 201b and the second sub-plurality 203 of mixer cells 203a, 203b in the second mode for providing the polar-modulated RF output signal 115. This is described below using FIGS. 2g-2j.

FIG. 2g shows, on the basis of the schematic block diagram from FIG. 2a, how the decoder 205 can provide control signals and oscillator signals for the plurality of mixer cells 201a, 201b, 203a, 203b in the described case of the use of the first sub-plurality 201 of mixer cells 201a, 201b and the second sub-plurality 203 of mixer cells 203a, 203b for providing the polar-modulated RF output signal 115.

The implementation of the RF-DAC 105 shown in FIG. 2g differs from the implementation shown in FIG. 2d insofar as the decoder 205 is furthermore designed to provide the oscillator signal 109 for the second sub-plurality 203 of the mixer cells 203a, 203b, and insofar as the decoder 205 is furthermore designed to provide a plurality of polar modulation control signals 241a, 241b, 241c, 241d for the first sub-plurality 201 of mixer cells 201a, 201b and for the second sub-plurality 203 of mixer cells 203a, 203b. By using the first sub-plurality 201 and the second sub-plurality 203 for providing the polar-modulated RF output signal 115, it is possible to achieve double the number of different amplitudes for the polar-modulated RF output signal 115, in comparison with the implementation in FIG. 2b, since double the number of mixer cells 201a, 201b, 203a, 203b are used for providing the polar-modulated RF output signal 115.

One important difference when FIG. 2g and FIG. 2a are compared is that the decoder 205 is designed to provide one and the same oscillator signal 109 for the first sub-plurality 201 of mixer cells 201a, 201b and for the second sub-plurality 203 of mixer cells 203a, 203b in the second mode, while the decoder 205 in the first mode provides the in-phase oscillator signal 209a for the first sub-plurality 201 of mixer cells 201a, 201b and the quadrature oscillator signal 209b for the second sub-plurality 203 of mixer cells 203a, 203b, wherein the quadrature oscillator signal 209b is phase-shifted in relation to the in-phase oscillator signal 209a. To put it another way, the decoder 205 is designed to provide, in the first mode, a first version of the oscillator signal 109 (e.g. the in-phase oscillator signal 209a) for the first sub-plurality 201 of mixer cells 201a, 201b and a second version of the oscillator signal 109 (e.g. the quadrature oscillator signal 209b) for the second sub-plurality 203 of mixer cells 203a, 203b, wherein the second version of the oscillator signal 109 is phase-shifted in relation to the first version of the oscillator signal 109. Furthermore, the decoder 205 is designed to provide, in the second mode, the same version of the oscillator signal 109 (e.g. the oscillator signal 109 itself) for the first sub-plurality 201 of mixer cells 201a, 201b and for the second sub-plurality 203 of mixer cells 203a, 203b.

Figure 2H:
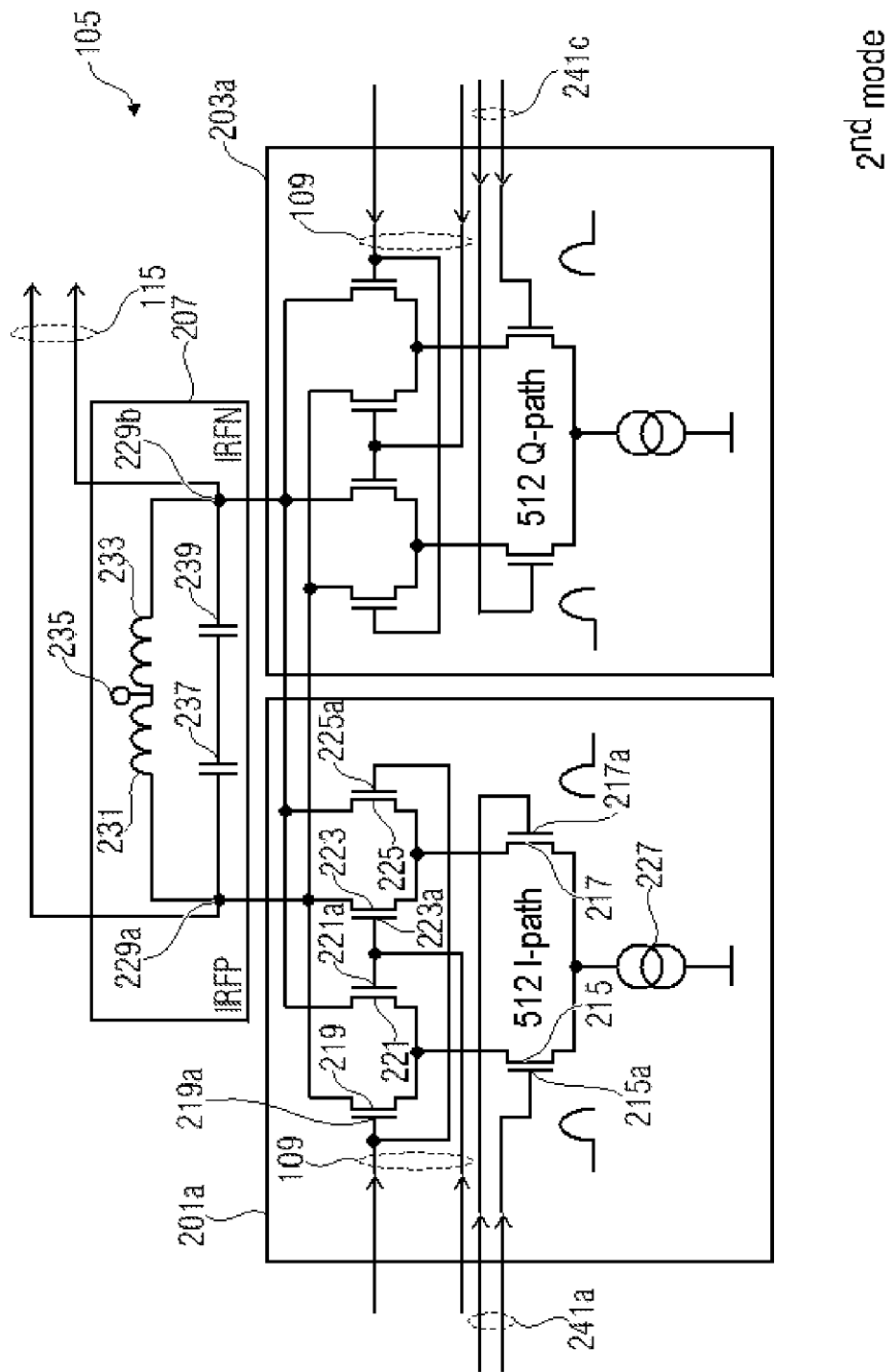
FIG. 2h shows, on the basis of the circuit diagram in FIG. 2b, how oscillator signals and control signals can be provided for the mixer cells in the second mode, on the basis of the implementation of the RF-DAC shown in FIG. 2g.

FIG. 2h shows, on the basis of the circuit diagram from FIG. 2b, how the oscillator signals and the control signals can be provided for the mixer cells 201a, 201b, 203a, 203b in the second mode, on the basis of the implementation of the RF-DAC 105 shown in FIG. 2g.

Consequently, FIG. 2h differs from FIG. 2e insofar as not only does the in-phase mixer cell 201a receive the oscillator signal 109, but the quadrature mixer cell 103a also receives the oscillator signal 109. Furthermore, the quadrature mixer cell 103a receives a further polar modulation control signal 241c. Since the in-phase mixer cell 201a and the quadrature mixer cell 203a receive the same oscillator signal 109, signals which are generated at the first differential output terminal 229a and the second differential output terminal 229b by the in-phase mixer cell 201a and the quadrature mixer cell 203a can have the same phase (e.g. with no phase difference). In contrast thereto, in the first mode of the RF-DAC 105, on account of the phase-shifted versions of the oscillator signals 209a, 209b, which are provided for the in-phase mixer cell 201a and the quadrature mixer cell 203a, the output signals of the in-phase mixer cell 201a and of the quadrature mixer cell 203a are phase-shifted relative to one another.

To summarize, the difference between the implementation of the RF-DAC 105 shown in FIG. 2h and the implementation of the RF-DAC 105 shown in FIG. 2e is that the decoder 205 is furthermore designed to provide the oscillator signal 109 and the polar modulation control signals 241c for the quadrature mixer cell 203a in such a way that the in-phase mixer cell 201a and the quadrature mixer cell 203a both participate in providing the polar-modulated RF output signal 115.

FIG. 2i shows, in a simplified circuit diagram, how the mixer cells 201a, 201b, 203a, 203c can be connected to the common summing terminal 207 or HF balun 207 in parallel, in such a way that a superposition of the currents generated in the controllable current sources of the mixer cells 201a, 201b, 203a, 203c at the common summing terminal 207 is the polar-modulated RF output signal 115 (as the differential signal).

Figure 2J:
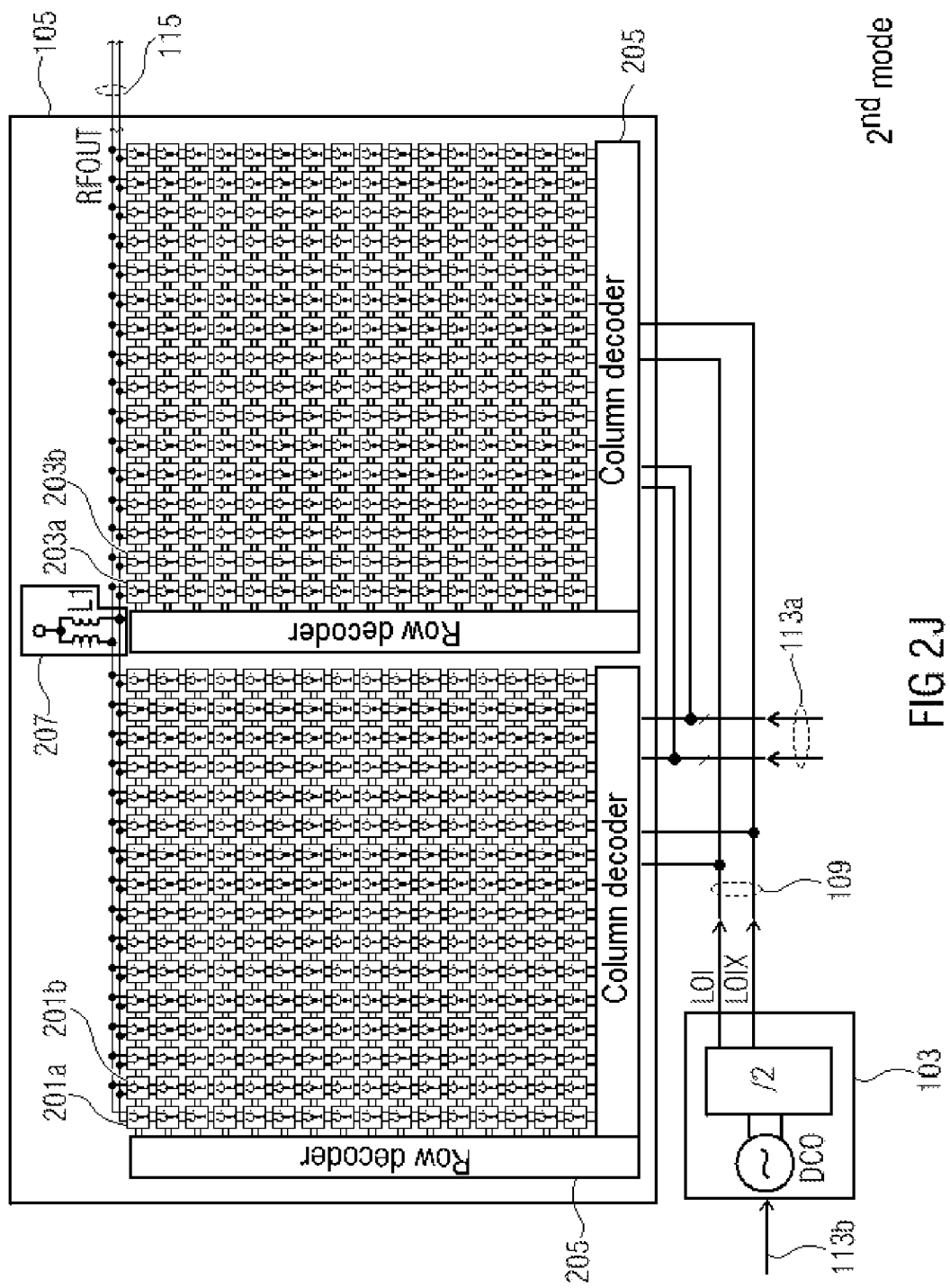
FIG. 2j shows how the control signals and oscillator signals can be provided for the complete RF-DAC, shown in FIG. 2c, in the second mode on the basis of the implementation of the RF-DAC described in conjunction with FIG. 2g.

FIG. 2j shows how the control signals and oscillator signals can be provided for the complete RF-DAC 105 shown in FIG. 2c in the second mode, on the basis of the implementation of the RF-DAC 105 described in conjunction with FIG. 2g.

It can be seen that the first row decoder and the first column decoder for the first sub-plurality 201 of mixer cells 201a, 201b and the second row decoder and the second column decoder for the second sub-plurality 203 of mixer cells 203a, 203b are designed to receive the amplitude component 113a of the second baseband signal 113, on the basis of which they determine the plurality of polar modulation control signals for their mixer cells 201a, 201b, 203a, 203b.

Furthermore, it can be seen that the decoders for the first sub-plurality 201 of mixer cells 201a, 201b and the second sub-plurality 203 of mixer cells 203a, 203b receive one and the same oscillator signal 109.

Consequently, the implementation of the RF-DAC 105 shown in FIG. 2j differs from the implementation of the RF-DAC 105 shown in FIG. 2f insofar as, in addition to the first sub-plurality 201 of mixer cells 201a, 201b, the second sub-plurality 203 of mixer cells 203a, 203b is also used in the second mode for providing the polar-modulated RF output signal 115.

To summarize, the RF-DAC 105 shown in FIG. 2f uses all 1,024 I- and Q-mixers for providing the vector-modulated RF output signal 111 in the first mode and the polar-modulated RF output signal 115 in the second mode.

In accordance with further exemplary embodiments of the present invention, a combination of the implementations shown in FIG. 2d and FIG. 2g is possible. As an example, the RF-DAC 105 (e.g. depending on a bit depth of the amplitude component 113a of the second baseband signal 113) can be adjustable with regard to the number of mixer cells which are used for providing the polar-modulated RF output signal 115. As an example, for low bit depths of the amplitude component 113a, the RF-DAC 105 can be designed to use only the first sub-plurality 201 of mixer cells 201a, 201b, or only the second sub-plurality 203 of mixer cells 203a, 203b for providing the polar-modulated RF output signal 115, while for a high bit depth of the amplitude component 113a the RF-DAC 105 can be designed to use both the first sub-plurality 201 of mixer cells 201a, 201b and the second sub-plurality 203 of mixer cells 203a, 203b for providing the polar-modulated RF output signal 115.

To summarize, the transmitter 100 comprises the RF-DAC 105 designed to provide the vector-modulated RF output signal 111 on the basis of the first baseband signal 107 in the first mode and the polar-modulated RF output signal 115 on the basis of the second baseband signal 113 (e.g. on the basis of the amplitude component 113a of the second baseband signal 113) in the second mode. The RF-DAC 105 has a plurality of mixer cells 201a, 201b, 203a, 203b for providing the vector-modulated RF output signal 111 in the first mode and for providing the polar-modulated RF output signal 115 in the second mode. The RF-DAC 105 is designed in such a way that at least one portion of the plurality of mixer cells 201a, 201b, 203a, 203b (e.g. the first sub-plurality 201 of mixer cells 201a, 201b) is used in the first mode for providing the vector-modulated RF output signal 111 and is furthermore used in the second mode for providing the polar-modulated RF output signal 115.

Figure 3A:
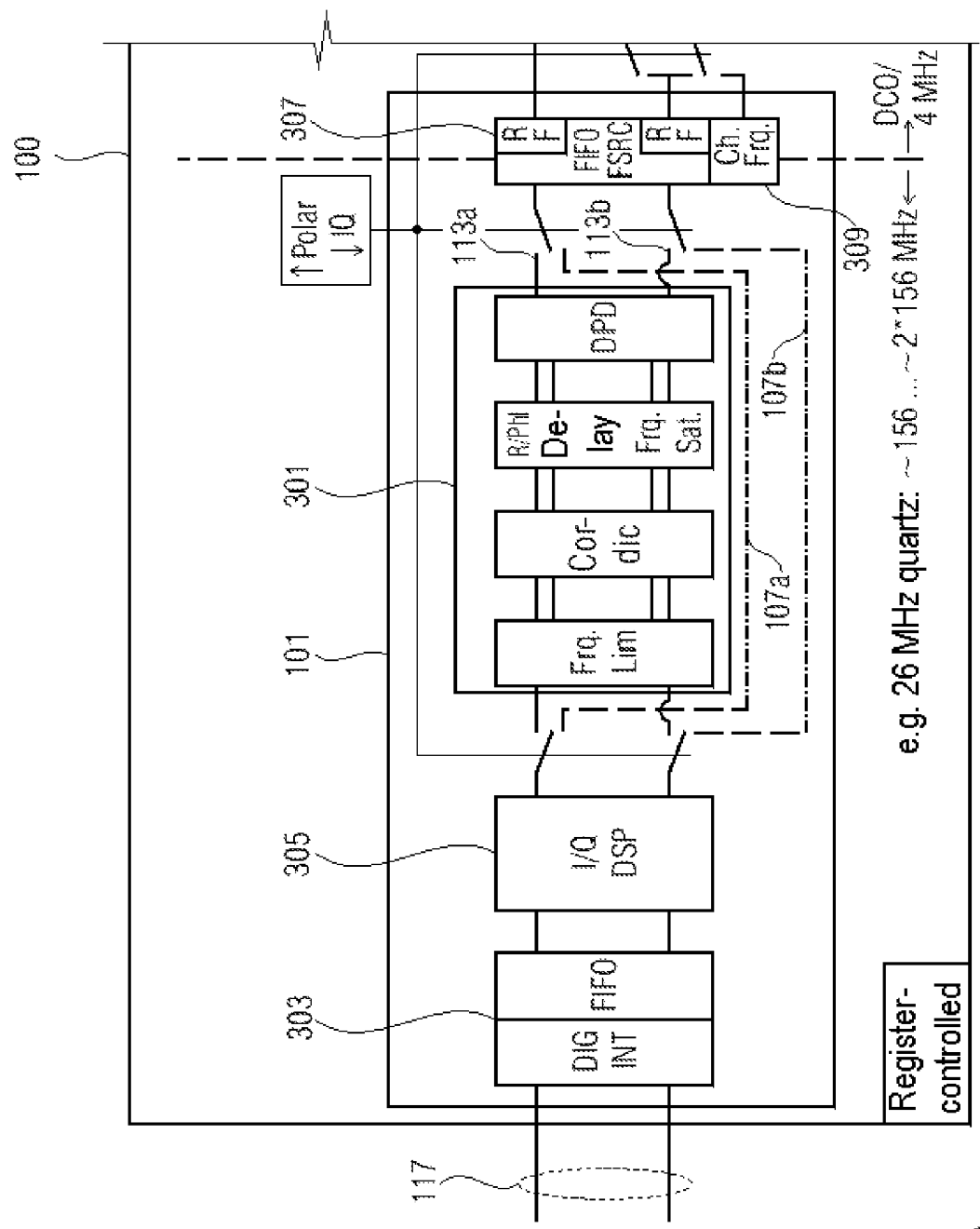
FIGS. 3a-3b show a schematic block diagram of a transmitter in accordance with a further exemplary embodiment of the present invention.
Figure 3B:
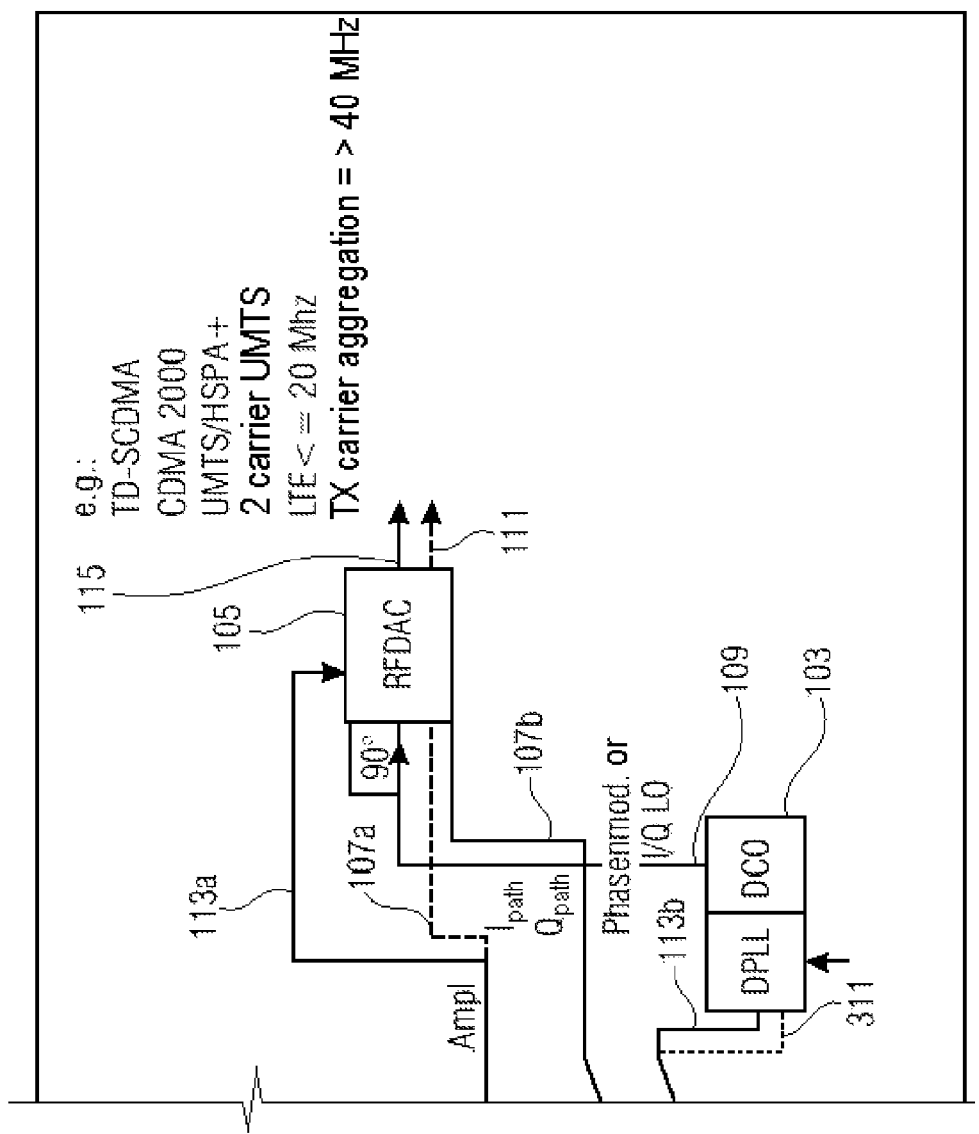

FIG. 3 shows, in a schematic block diagram, the transmitter 100 for the first mode and the second mode with one possible implementation for the baseband signal path 101, which can be changed over between the first mode (e.g. IQ modulation or vector modulation mode) and the second mode (polar modulation). The signal paths for the first mode are illustrated visibly by means of dashed lines in FIG. 3, while the signal paths for the second mode are illustrated visibly by means of solid lines.

As can be discerned from FIG. 3, the baseband signal path can have a Cordic module 301 for determining the amplitude component 113a and the phase component 113b of the second baseband signal 113, if the transmitter 100 is in the second mode. The baseband signal path 101 can be designed to bypass the Cordic module 301 in the first mode. Furthermore, the baseband signal path 101 can have a digital interface 303 for receiving the digital signals 117 (e.g. with a first-in first-out memory (FIFO)). Furthermore, the baseband signal path 101 can have a digital signal processor 305 for determining an in-phase component and a quadrature component of the digital signals 117 (which can be e.g. identical to the in-phase component 107a and the quadrature component 107b of the first baseband signal 107). The Cordic module 301 can be designed to receive said in-phase component and said quadrature component, which are provided by the digital signal processor 305, in order to determine the second baseband signal 113 (having the amplitude component 113a and the phase component 113b) on the basis of said in-phase component and said quadrature component in the second mode of the transmitter 100. As has already been mentioned, in the first mode of the transmitter 100 the Cordic module 301 can be skipped, e.g. in the described case in which the in-phase component and the quadrature component provided by the digital processor 305 are already the in-phase component 107a and the quadrature component 107b of the first baseband signal 107. Furthermore, the baseband signal path 101 can have an output first-in first-out memory 307 designed to provide the in-phase component 107a and the quadrature component 107b for the RF-DAC 105 in the first mode and to provide the amplitude component 113a for the RF-DAC 105 and the phase component 113b for the oscillator circuit 103 in the second mode.

Furthermore, the baseband signal path 101 can have a channel frequency provider 309 for providing a channel frequency setting signal 311 in the first mode of the transmitter, which defines a frequency of the oscillator signal 109 and which is provided as an unmodulated signal.

In the example shown in FIG. 3, the oscillator circuit 103 has a DPLL (digital phase locked loop) and a DCO (digitally controlled oscillator), while other implementatons of the oscillator circuit are likewise possible, using e.g. a VCO (voltage controlled oscillator). As an example, the oscillator circuit 103 can have the DPLL for modulating the oscillator signal 109 depending on the phase component 113b of the second baseband signal 113.

To summarize, FIG. 3 shows one implementation of a configurable transmitter 100 with a configurable RF-DAC 105, which comprises the baseband signal path 101, which is configurable for vector modulation (IQ) or polar modulation data, and the oscillator circuit 103 (which has e.g. a DCO or VCO), which is configurable for a fixed RF-LO frequency (in the first mode of the transmitter 100) or a phase-modulated LO signal (in the second mode of the transmitter 100). The RF-DAC 105 is configurable via the LO (oscillator signal 109) and the baseband signals 107, 113 in such a way that the same circuit arrangement (e.g. the same mixer cells, as described above) can be used to generate either a vector- (or IQ-) modulated RF output signal 111 or a polar-modulated RF output signal 115.

As has already been mentioned, the RF-DAC 105 could be used either completely or partly for the corresponding mode, as e.g. in the example shown in FIGS. 2d-2j the RF-DAC 105 in the polar modulator mode could be configured to use either the 512 I-mixers or the 512 Q-mixers or all 1024 I- and Q-mixers.

As can be seen in FIG. 3, the oscillator circuit 103 can be coupled to the RF-DAC 105 with the aid of an LO path. Said LO path can be designed to transmit either a modulated synthesizer signal or oscillator signal 109 (in the second mode of the transmitter 100) or an unmodulated synthesizer signal or oscillator signal 109 (in the first mode of the transmitter 100).

Furthermore, the RF-DAC 105 (or the RF mixer 105) can be designed to modulate vector-modulated signals (in the first mode of the transmitter 100) or polar-modulated signals (in the second mode of the transmitter 100).

Figure 4A:
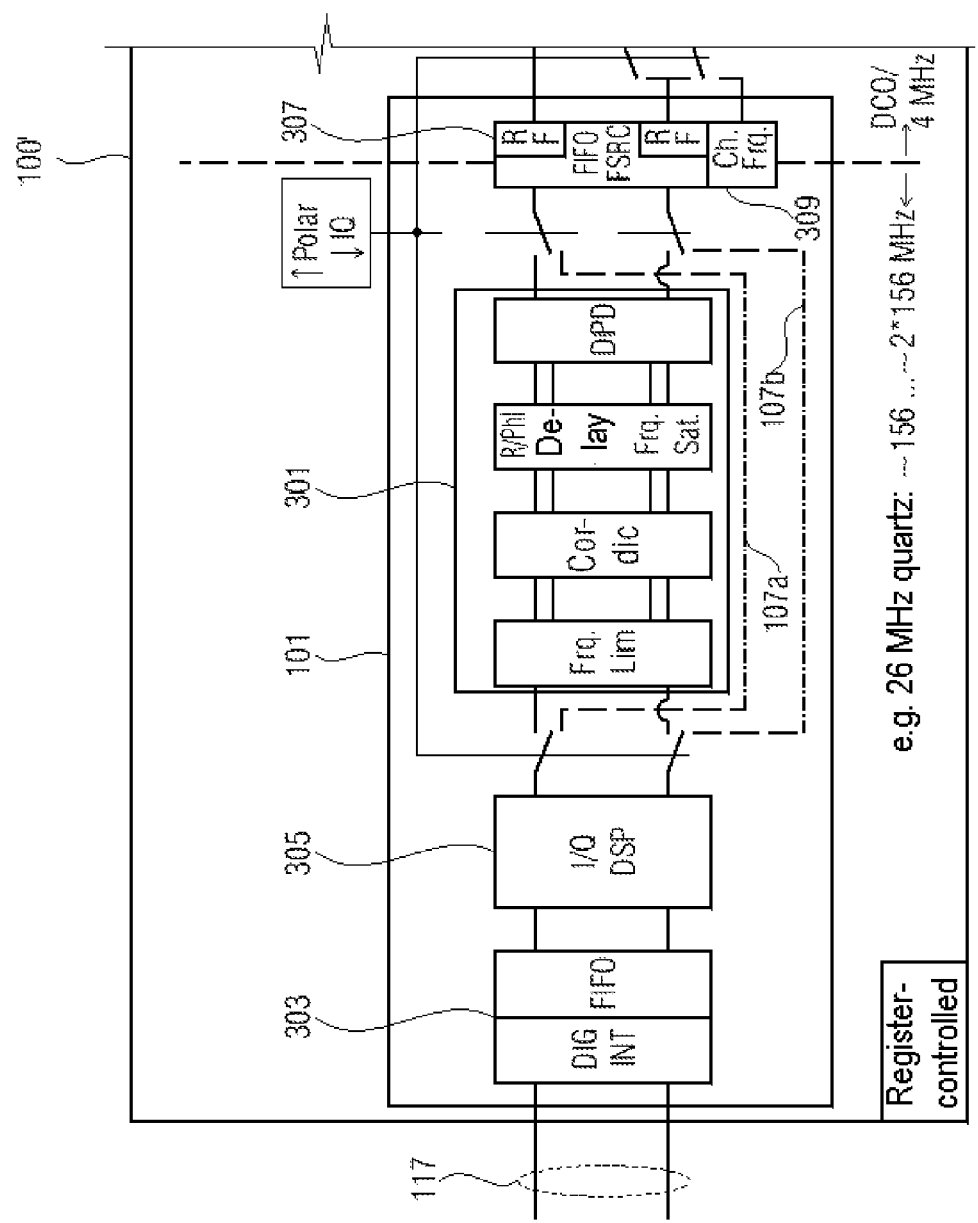
FIGS. 4a-4b show a schematic block diagram of a transmitter in accordance with a further exemplary embodiment of the present invention.
Figure 4B:
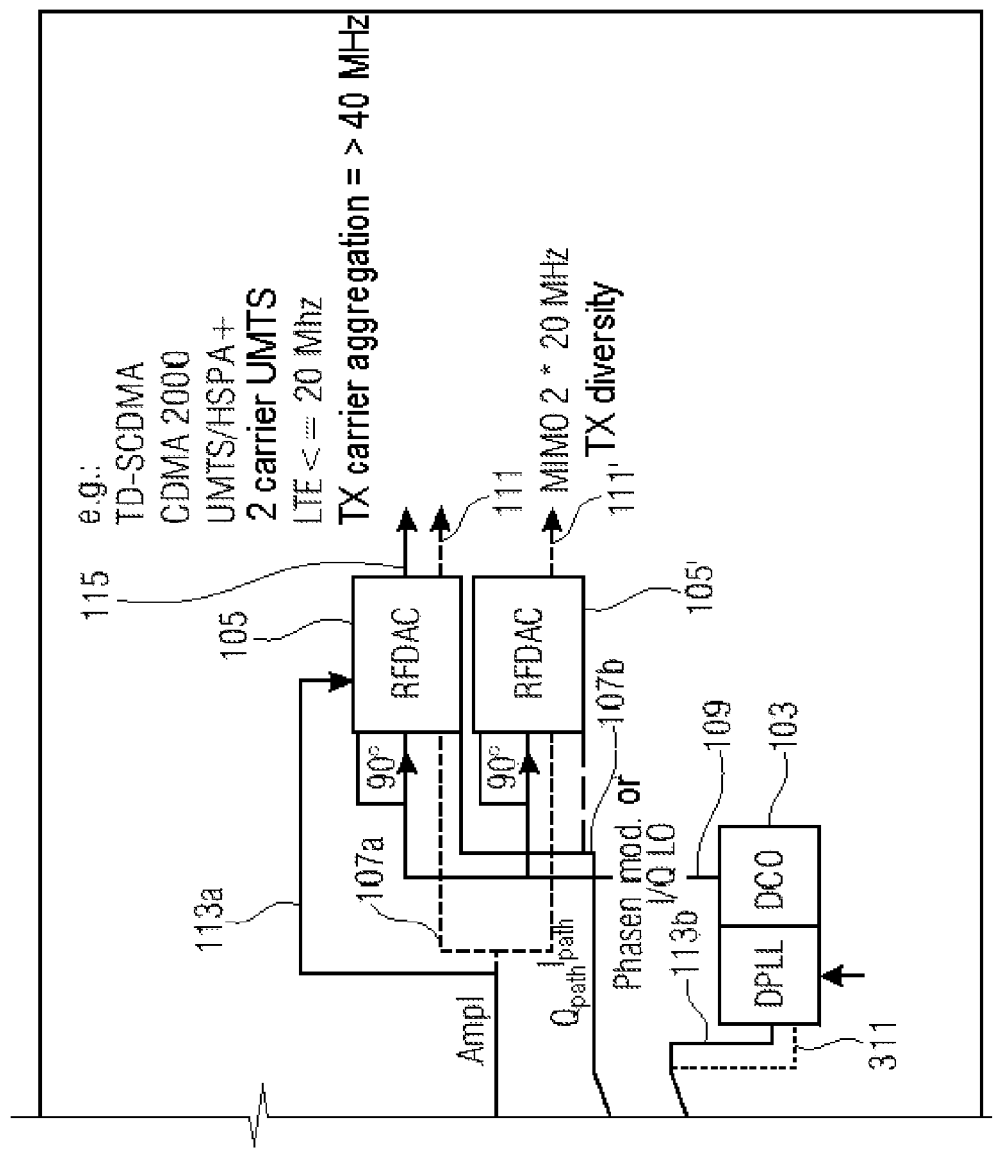

FIG. 4 shows an implementation of a further transmitter 100' or TX modulator 100', which differs from the implementation of the transmitter 100 shown in FIG. 3 insofar as the transmitter 100' has two RF-DACs 105, 105'. To put it another way, the transmitter 100' has an additional RF-DAC 105' in comparison with the transmitter 100.

The second RF-DAC 105' can be advantageus if two output signals, e.g. two TX output signals, are required simultaneously, e.g. in a TX diversity mode, a dual carrier mode (3G), an intraband carrier aggregation mode (as e.g. in the case of LTE) and in an MIMO mode (multiple input multiple output). For such a concept, the polar architecture would require two independent, modulated RF-DCO paths (and therefore two independent oscillator circuits 103). In contrast thereto, the transmitter 100' can operate in the first mode (in the vector modulation mode) for such antenna diversity modes, dual carrier modes, intraband carrier aggregation modes and MIMO modes using an individual RF synthesizer (or an individual oscillator circuit 103), and can operate in the second mode if only one output signal is intended to be provided.

To put it another way, the transmitter 100' can be designed to provide two RF output signals simultaneously using the first mode of the transmitter 100'. To put it another way, the transmitter 100' is designed to switch from the second mode into the first mode if two RF output signals are required simultaneously, and to provide the vector-modulated RF output signal 111 and a further vector-modulated RF output signal 111' in said first mode.

To summarize, FIG. 4 shows a configurable transmitter 100' in accordance with one exemplary embodiment of the present invention with two transmission paths (e.g. two RF-DACs 105, 105'), which can be used in MIMO modes, carrier aggregation modes, dual carrier modes or diversity modes.

As one example, the transmitter 100' can be designed to switch from the second mode (polar modulation) into the first mode (vector modulation) during the transition between LTE 20 (in which only one RF output signal has to be provided) and the LTE 2×20 carrier aggregation (in which two RF output signal have to be provided simultaneously). As a further example, the transmitter 100' can be designed to switch from the second mode (polar modulator mode) into the first mode (vector modulation mode) during a transition between the 1×1 TX mode and the 2×2 MIMO mode.

To put it another way, the transmitter 100' is furthermore designed to provide the further RF output signal 111', and the transmitter 100' is furthermore designed, if it is operating in the second mode (e.g. supplying the polar-modulated RF output signal 115) and the further RF output signal is intended to be provided (e.g. on account of a transition from a non-diversity mode to a diversity mode), to switch into the first mode (vector modulation mode), in such a way that the vector-modulated RF output signal 111 and the further (vector-modulated) RF output signal 111' are provided simultaneously.

Further exemplary embodiments relate to a device comprising the following features: a transmitter in accordance with one exemplary embodiment of the present invention (e.g. transmitter 100 or 100'), a baseband processor, which is coupled to the transmitter and is designed to provide data signals (e.g. the data signals 117) for the baseband signal path of the transmitter, on the basis of which the baseband signal path supplies the first baseband signal and the second baseband signal, and an antenna, which is coupled to the transmitter and is designed to transmit the vector-modulated RF output signal and the polar-modulated RF output signal or, to put it another way, is designed to receive the vector-modulated RF output signal and the polar-modulated RF output signal and to transmit the vector-modulated RF output signal and the polar-modulated RF output signal (e.g. via an air interface).

As an example, such a device can be a mobile handheld device such as, for example, a mobile telephone or a cellular telephone, a smartphone, a tablet PC, a mobile broadband modem, a notebook, a laptop or else a router or personal computer.

Figure 5:
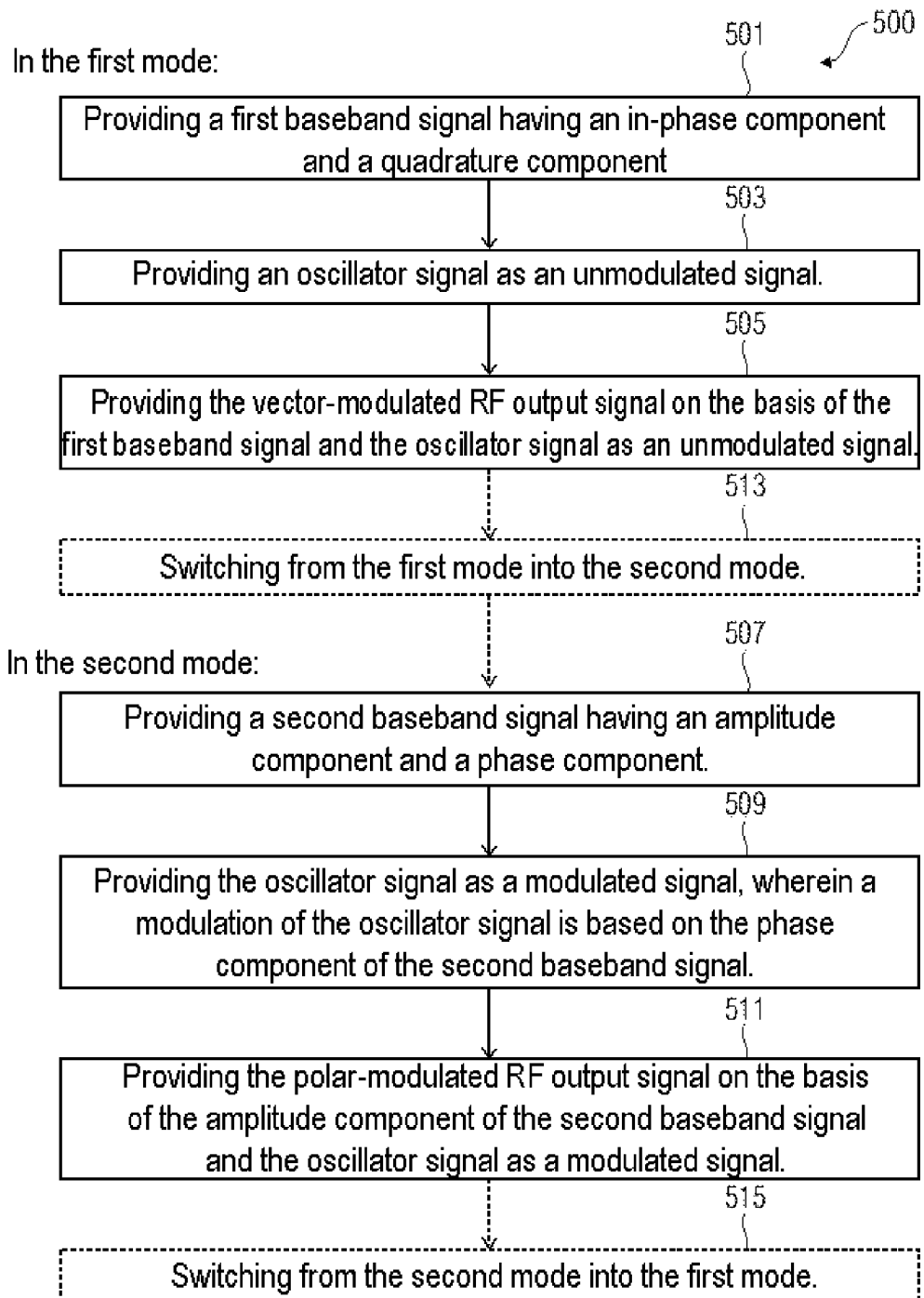
FIG. 5 shows a flow chart of a method in accordance with one exemplary embodiment of the present invention.

FIG. 5 shows a flow chart of a method 500 for supplying a vector-modulated RF output signal in a first mode and a polar-modulated RF output signal in a second mode.

The method 500 comprises a step 501 for providing a first baseband signal in the first mode having an in-phase component and a quadrature phase component.

Furthermore, the method 500 comprises a step 503 for providing an oscillator signal as an unmodulated signal in the first mode.

Furthermore, the method 500 comprises a step 505 for providing the vector-modulated RF output signal in the first mode on the basis of the first baseband signal and the oscillator signal (which is provided) as an unmodulated signal.

Furthermore, the method 500 comprises a step 507 for providing a second baseband signal having an amplitude component and a quadrature component in the second mode.

Furthermore, the method 500 comprises a step 509 for providing an oscillator signal as a modulated signal in the second mode, wherein a modulation is based on the phase component of the second baseband signal.

Furthermore, the method 500 comprises a step 511 for providing the polar-modulated RF output signal in the second mode, on the basis of the amplitude component of the second baseband signal and of the oscillator signal (which is provided) as a modulated signal.

In accordance with further exemplary embodiments, the method 500 can comprise a step 513 for switching from the first mode into the second mode and/or a step 515 for switching from the second mode into the first mode.

The steps 505, 511 can be performed by one and the same RF-DAC 105, e.g. using a plurality of mixer cells for providing the vector-modulated RF output signal and also the polar-modulated RF output signal.

The method 500 can be performed by a transmitter in accordance with one exemplary embodiment of the present invention, e.g. the transmitter 100 or the transmitter 100'.

Figure 6:
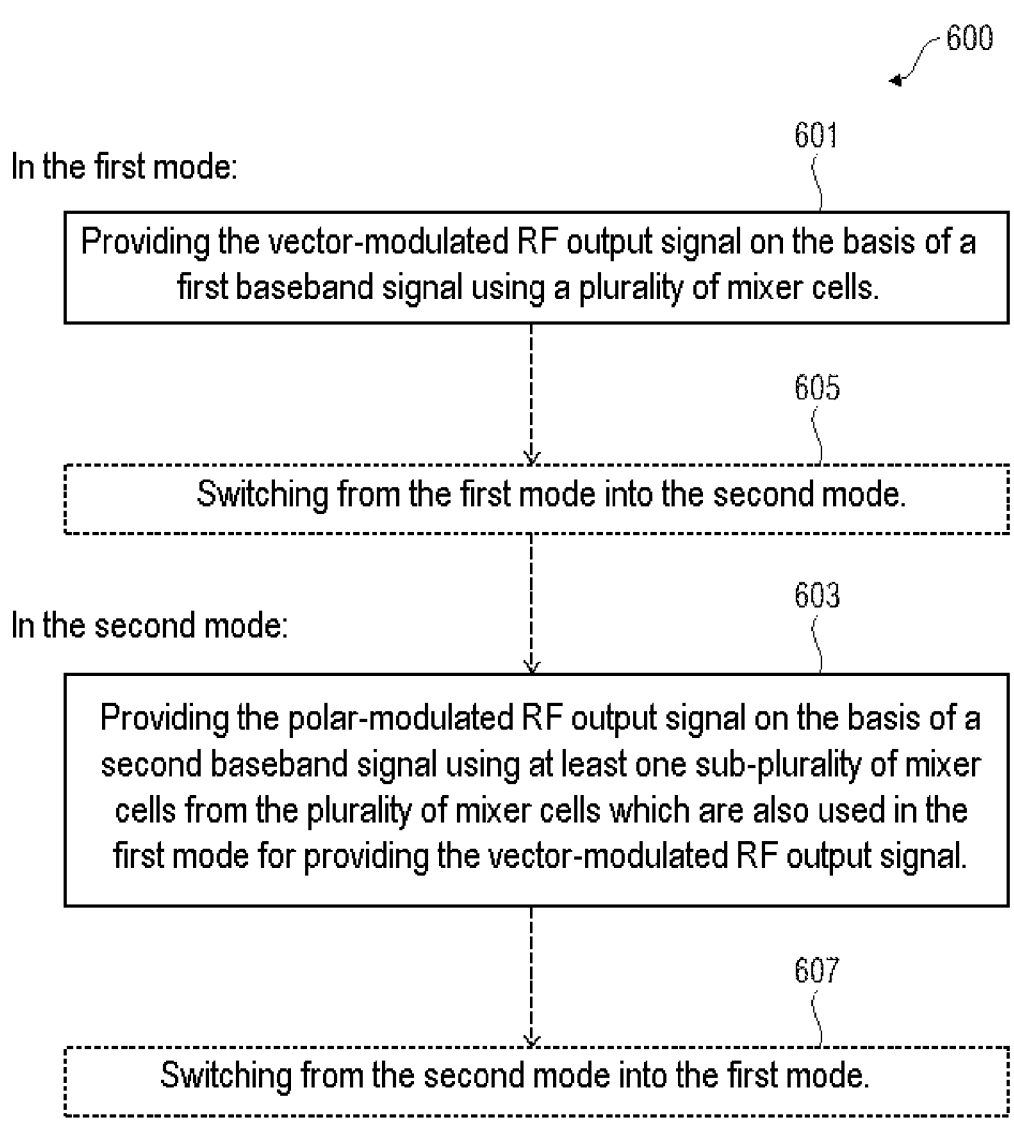
FIG. 6 shows a flow chart of a method in accordance with a further exemplary embodiment of the present invention.

FIG. 6 shows a flow chart of a method in accordance with a further exemplary embodiment of the present invention.

The method 600 comprises a step 601 for providing a vector-modulated RF output signal in a first mode on the basis of a first baseband signal using a plurality of mixer cells.

Furthermore, the method 600 comprises a step 603 for supplying a polar-modulated RF output signal in a second mode on the basis of a second baseband signal using at least one portion of the plurality of mixer cells which are used in the first mode for providing the vector-modulated RF output signal.

In accordance with further exemplary embodiments, the method 600 can comprise a step 605 for switching from the first mode into the second mode and/or a step 607 for switching from the second mode into the first mode.

The method 600 can be performed by any transmitter or RF-DAC of the present invention, e.g. by the RF-DAC 105 or the transmitters 100, 100'.

The methods 500, 600 can be supplemented by any of the features and of the functionalities described herein with regard to the devices, and can be implemented using the hardware components of the devices.

Some aspects of the exemplary embodiments of the present invention are summarized below.

Exemplary embodiments of the present invention can be specifically combined with an MIMO option described in the 2G/3G/4G or WLAN standard.

Furthermore, exemplary embodiments of the present invention can be specifically combined with the use of an individual RF-DAC TX architecture.

In accordance with exemplary embodiments of the present invention, the signals within the transmitter 100 (e.g. with the exception of the vector-modulated RF output signal 111 and the polar-modulated RF output signal 115) can be fully digital. As an example, the first baseband signal 107, the second baseband signal 113 and/or the oscillator signal 109 can be provided as digital signals. Furthermore, the data signals 117 can also be provided as digital signals. Consequently, a signal processing within the baseband signal path 101 can be implemented digitally.

To summarize, exemplary embodiments of the present invention have the advantage that, for transmission modes in which a polar modulation is sufficient, the polar modulation mode (the second mode) of the transmitter 100 can be used, which yields a higher power efficiency than a power efficiency of a vector modulator since, on account of quadrature mixing, with a doubling of the output current, the output power is increased only by 3 dB using vector modulation.

Although some aspects have been described in the context of a device, it goes without saying that these aspects also constitute a description of the corresponding method, where a block or a device corresponds to a method step or to a feature of a method step. Analogously, aspects described in the context of a method step also constitute a description of a corresponding block or element or feature of a corresponding device. Some or all of the method steps can be performed by a (or using a) hardware device, such as e.g. a microprocessor, a programmable computer or an electronic circuit. In some exemplary embodiments, one or a plurality of the most important method steps can be performed by such a device.

Depending on specific implementation requirements, exemplary embodiments of the invention can be implemented in hardware or in software. The implementation can be effected using a digital storage medium, e.g. a floppy disk, a DVD, a Blu-Ray, a CD, a ROM, a PROM, an EPROM, an EEPROM or a flash memory, on which electronically readable control signals are stored, which cooperate (or can cooperate) with a programmable computer system in such a way that the corresponding method is performed. Therefore, the digital storage medium can be computer-readable.

Some exemplary embodiments according to the invention comprise a data carrier with electronically readable control signals that are able to cooperate with a programmable computer system in such a way that one of the methods described herein is performed.

In general, exemplary embodiments of the present invention can be implemented as a computer program product comprising a program code, wherein the program code is effective for executing one of the methods when the computer program product runs on a computer. The program code can be stored e.g. on a machine-readable carrier.

Other exemplary embodiments comprise the computer program for executing one of the methods described herein, which is stored on a machine-readable carrier.

To put it another way, one exemplary embodiment of the method according to the invention is therefore a computer program comprising a program code for executing one of the methods described herein when the computer program runs on a computer.

A further exemplary embodiment of the methods according to the invention is therefore a data carrier (or a digital storage medium, or a computer-readable medium) having, recorded thereon, the computer program for executing one of the methods described herein. The data carrier, the digital storage medium or the recorded medium are usually tangible and/or non-volatile.

A further exemplary embodiment of the method according to the invention is therefore a data stream or a sequence of signals which represents the computer program for executing one of the methods described herein. The data stream or the sequence of signals can be designed e.g. to be transmitted via a data communication connection, e.g. via the Internet.

A further exemplary embodiment comprises a processing unit, e.g. a computer or a programmable logic device, which is designed or adapted to implement one of the methods described herein.

A further exemplary embodiment comprises a computer on which the computer program for executing one of the methods described herein is installed.

A further exemplary embodiment according to the invention comprises a device or a system designed to transmit (e.g. electronically or optically) a computer program for executing one of the methods described herein to a receiver. The receiver can be e.g. a computer, a mobile device, a storage device or the like. The device or the system can comprise e.g. a file server for transmitting the computer program to the receiver.

In some exemplary embodiments, a programmable logic device (e.g. a field programmable gate array) can be used to implement some or all of the functionalities of the methods described herein. In some exemplary embodiments, a field programmable gate array can cooperate with a microprocessor in order to execute one of the methods described herein. In general, the methods are preferably executed by any desired hardware device.

The exemplary embodiments described above are merely representative of the principles of the present invention. It is pointed out that modifications and variations of the arrangements and of the details which are described herein are apparent to other persons skilled in the art. It is therefore the intention that the invention be restricted only by the scope of protection of the appended patent claims and not by the specific details presented by a description and explanation of the exemplary embodiments herein.

The invention claimed is:

1. A transmitter, comprising:
a baseband signal path, which is designed to provide a first baseband signal having an in-phase component and a quadrature component in a first mode of the transmitter and to provide a second baseband signal having an amplitude component and a phase component in a second mode of the transmitter;
an oscillator circuit, which is designed to provide an oscillator signal, wherein the oscillator circuit is furthermore designed to provide the oscillator signal as an unmodulated signal in the first mode and to provide the oscillator signal as a modulated signal in the second mode, wherein a modulation of the oscillator signal in the second mode is based on the phase component of the second baseband signal; and
a radio-frequency digital-to-analogue converter (RF-DAC), which is designed to receive the oscillator signal, the first baseband signal and the amplitude component of the second baseband signal, wherein the RF-DAC is furthermore designed to provide a vector-modulated RF output signal on the basis of the first baseband signal and the oscillator signal in the first mode and to provide a polar-modulated RF output signal on the basis of the amplitude component of the second baseband signal and the oscillator signal in the second mode,
wherein the transmitter is designed to switch from the first mode into the second mode or from the second mode into the first mode depending on a modulation bandwidth of the resulting RF output signal of the transmitter; or
wherein the transmitter is designed to provide a further RF output signal, and wherein the transmitter is furthermore designed, if it is operating in the second mode and the further RF output signal is intended to be provided, to switch into the first mode, in such a way that the vector-modulated RF output signal and the further RF output signal are provided simultaneously.

2. The transmitter according to claim 1,
wherein the RF-DAC has a plurality of mixer cells for providing the vector-modulated RF output signal in the first mode and the polar-modulated RF output signal in the second mode; and
wherein the RF-DAC is designed in such a way that at least one first sub-plurality of mixer cells from the plurality of mixer cells is used for providing the vector-modulated RF output signal in the first mode and is furthermore used for providing the polar-modulated RF output signal in the second mode.

3. The transmitter according to claim 2,
wherein a first mixer cell of the one first sub-plurality of mixer cells which are used in the first mode and the second mode has an oscillator terminal; and
wherein the RF-DAC has a decoder, which is designed to receive the oscillator signal and to provide the oscillator signal or a signal derived from the oscillator signal in the first mode and the second mode at a same oscillator terminal of the first mixer cell.

4. The transmitter according to claim 2,
wherein the RF-DAC has a decoder designed, for a first mixer cell of the one first sub-plurality of mixer cells that are used in the first mode and the second mode, in the first mode to determine a vector modulation control signal based on the in-phase component or the quadrature component of the first baseband signal, and in the second mode to determine a polar modulation control signal based on the amplitude component of the second baseband signal; and
wherein the decoder is furthermore designed to provide the vector modulation control signal and the polar modulation control signal at a same terminal of the first mixer cell.

5. The transmitter according to claim 4,
wherein the decoder is designed to determine the polar modulation control signal for the first mixer cell independently of the phase component of the second baseband signal.

6. The transmitter according to claim 1,
wherein the RF-DAC has a plurality of mixer cells for providing the vector-modulated RF output signal in the first mode and the polar-modulated RF output signal in the second mode;
wherein the RF-DAC furthermore has a decoder designed, in the first mode to:
provide for a first sub-plurality of mixer cells, from the plurality of mixer cells, a plurality of first vector modulation control signals which are based on the in-phase component of the first baseband signal, and
to provide for a second sub-plurality of mixer cells, from the plurality of mixer cells, a plurality of second vector modulation control signals which are based on the quadrature component of the first baseband signal, wherein the first sub-plurality and the second sub-plurality of mixer cells are disjoint; and
wherein the decoder is designed, in the second mode to provide, for the first sub-plurality of mixer cells or for the second sub-plurality of mixer cells, a plurality of polar modulation control signals which are based on the amplitude component of the second baseband signal.

7. The transmitter according to claim 6,
wherein the decoder is designed to provide, in the second mode, the plurality of polar modulation control signals for the first sub-plurality of mixer cells and for the second sub-plurality of mixer cells.

8. The transmitter according to claim 7,
wherein the decoder is designed to provide, in the first mode, a first version of the oscillator signal for the first sub-plurality of mixer cells and a second version of the oscillator signal for the second sub-plurality of mixer cells, wherein the second version of the oscillator signal is phase-shifted with respect to the first version of the oscillator signal; and
wherein the decoder is furthermore designed to provide, in the second mode, a same version of the oscillator signal for the first sub-plurality of mixer cells and for the second sub-plurality of mixer cells.

9. The transmitter according to claim 8,
wherein the transmitter is designed to switch from the second mode into the first mode if the modulation bandwidth of a resulting RF output signal is above a predetermined modulation bandwidth threshold, in such a way that a maximum modulation bandwidth of the polar-modulated RF output signal is equal to the predetermined modulation bandwidth threshold.

10. The transmitter according to claim 1,
wherein the baseband signal path is designed to receive a data signal, and on the basis of the data signal to determine the first baseband signal in the first mode and the second baseband signal in the second mode.

11. The transmitter according to claim 10,
wherein the baseband signal path has a Cordic module for determining, in the second mode, the second baseband signal having the amplitude component and the phase component, on the basis of the data signal.

12. The transmitter according to claim 11,
wherein the baseband signal path is designed to bypass the Cordic module in the first mode.

13. The transmitter according to claim 1,
wherein the RF-DAC has a plurality of mixer cells for providing the vector-modulated RF output signal in the first mode and for providing the polar-modulated RF output signal in the second mode; and
wherein the RF-DAC furthermore has a common summing terminal, at which the transmitter provides the vector-modulated RF output signal in the first mode and the polar-modulated RF output signal in the second mode; and
wherein the plurality of mixer cells are coupled to the common summing terminal.

14. The transmitter according to claim 13,
wherein respective mixer cells of the plurality of mixer cells have a controllable current source; and
wherein the RF-DAC has a decoder, which is designed to provide, in the second mode at least for each mixer cell of a first sub-plurality from the plurality of mixer cells which are used for providing the vector-modulated RF output signal in the first mode and which are furthermore used for providing the polar-modulated RF output signal in the second mode, an assigned polar modulation control signal for activating and deactivating the controllable current source of the mixer cell depending on the amplitude component of the second baseband signal.

15. The transmitter according to claim 14,
wherein the decoder is designed to provide the polar modulation control signals for the first sub-plurality of mixer cells independently of the phase component of the second baseband signal.

16. The transmitter according to claim 1, further comprising:
a local oscillator path, which is coupled between the oscillator circuit and the RF-DAC and is designed to transmit the oscillator signal as an unmodulated signal in the first mode and to transmit the oscillator signal as a modulated signal in the second mode.

17. The transmitter according to claim 1,
wherein the transmitter is designed to switch from the second mode into the first mode during a transition from a non-carrier aggregation mode, a non-diversity mode, a single-carrier mode or a non-MIMO mode to a carrier aggregation mode, a diversity mode, a dual-carrier mode or a MIMO mode.

18. A transmitter, comprising:
an RF-DAC, which is designed to provide a vector-modulated RF output signal on the basis of a first baseband signal comprising an in-phase component and a quadrature component in a first mode and a polar-modulated RF output signal on the basis of a second baseband signal comprising an amplitude component and a phase component in a second mode; and
wherein the RF-DAC has a plurality of mixer cells for providing the vector-modulated RF output signal in the first mode and for providing the polar-modulated RF output signal in the second mode; and
wherein the RF-DAC is designed in such a way that at least one sub-plurality of mixer cells from the plurality of mixer cells is used in the first mode for providing the vector-modulated RF output signal on the basis of the first baseband signal and is furthermore used in the second mode for providing the polar-modulated RF output signal on the basis of the second baseband signal.

19. A device, comprising:
a transmitter, wherein the transmitter comprises:
a baseband signal path, which is designed to provide a first baseband signal having an in-phase component and a quadrature component in a first mode of the transmitter and to provide a second baseband signal having an amplitude component and a phase component in a second mode of the transmitter;
an oscillator circuit, which is designed to provide an oscillator signal, wherein the oscillator circuit is furthermore designed to provide the oscillator signal as an unmodulated signal in the first mode and to provide the oscillator signal as a modulated signal in the second mode, wherein a modulation of the oscillator signal in the second mode is based on the phase component of the second baseband signal; and
a radio-frequency digital-to-analogue converter (RF-DAC), which is designed to receive the oscillator signal, the first baseband signal and the amplitude component of the second baseband signal, wherein the RF-DAC is furthermore designed to provide the vector-modulated RF output signal on the basis of the first baseband signal and the oscillator signal in the first mode and to provide the polar-modulated RF output signal on the basis of the amplitude component of the second baseband signal and the oscillator signal in the second mode
a baseband processor, which is coupled to the transmitter and is designed to provide data signals for the baseband signal path, on the basis of which data signals the baseband signal path provides the first baseband signal and the second baseband signal; and
an antenna, which is coupled to the transmitter and which is designed to forward the vector-modulated RF output signal and the polar-modulated RF output signal.

20. A method for providing, in a transmitter, a vector-modulated output signal in a first mode and a polar-modulated output signal in a second mode, wherein the method comprises:
in the first mode:
providing a first baseband signal having an in-phase component and a quadrature component;
providing an oscillator signal as an unmodulated signal; and
providing the vector-modulated RF output signal on the basis of the first baseband signal and the oscillator signal as an unmodulated signal;
in the second mode:
providing a second baseband signal having an amplitude component and a phase component;
providing the oscillator signal as a modulated signal, wherein a modulation of the oscillator signal is based on the phase component of the second baseband signal; and
providing the polar-modulated RF output signal on the basis of the amplitude component of the second baseband signal and of the oscillator signal as a modulated signal
wherein the system switches from the first mode into the second mode or from the second mode into the first mode depending on a modulation bandwidth of the resulting RF output signal of the transmitter; or
wherein, if a further RF output signal is intended to be provided in the second mode, the system switches into the first mode, in such a way that the vector-modulated RF output signal and the further RF output signal are provided simultaneously.

21. A method for providing, in a transmitter, a vector-modulated RF output signal in a first mode and a polar-modulated RF output signal in a second mode, wherein the method comprises:
in the first mode:
providing the vector-modulated RF output signal on the basis of a first baseband signal using a plurality of mixer cells, wherein the first baseband signal comprises an in-phase component and a quadrature component; and
in the second mode:
providing the polar-modulated RF output signal on the basis of a second baseband signal using at least one sub-plurality of mixer cells from the plurality of mixer cells which are also used in the first mode for supplying the vector-modulated RF output signal, wherein the second baseband signal comprises an amplitude component and a phase component; and
switching from the first mode into the second mode or from the second mode into the first mode depending on a modulation bandwidth of the resulting RF output signal of the transmitter.

* * * * *